(12) United States Patent
Kunitake et al.

(10) Patent No.: US 12,132,057 B2
(45) Date of Patent: Oct. 29, 2024

(54) SEMICONDUCTOR DEVICE WITH TRANSISTORS INCLUDING OXIDE SEMICONDUCTORS AND CAPACITOR ELEMENTS

(71) Applicant: Semiconductor Energy Laboratory Co., Ltd., Kanagawa-ken (JP)

(72) Inventors: Hitoshi Kunitake, Kanagawa (JP); Tatsuya Onuki, Kanagawa (JP); Hajime Kimura, Kanagawa (JP); Takayuki Ikeda, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 421 days.

(21) Appl. No.: 17/639,744

(22) PCT Filed: Aug. 26, 2020

(86) PCT No.: PCT/IB2020/057946
§ 371 (c)(1),
(2) Date: Mar. 2, 2022

(87) PCT Pub. No.: WO2021/048672
PCT Pub. Date: Mar. 18, 2021

(65) Prior Publication Data
US 2022/0293603 A1    Sep. 15, 2022

(30) Foreign Application Priority Data

Sep. 9, 2019  (JP) ................................. 2019-163639

(51) Int. Cl.
*H01L 27/12*  (2006.01)
*H01L 29/786*  (2006.01)
*H10B 12/00*  (2023.01)

(52) U.S. Cl.
CPC ...... *H01L 27/1255* (2013.01); *H01L 27/1225* (2013.01); *H01L 29/78648* (2013.01); *H01L 29/7869* (2013.01); *H10B 12/00* (2023.02)

(58) Field of Classification Search
CPC .............. H01L 27/105; H01L 27/1225; H01L 27/1248; H01L 27/1251; H01L 27/1255;
(Continued)

(56) References Cited

U.S. PATENT DOCUMENTS

| 9,748,274 B2 | 8/2017 | Ishizu et al. |
| 10,223,194 B2 | 3/2019 | Aoki et al. |

(Continued)

FOREIGN PATENT DOCUMENTS

| JP | 2007-123861 A | 5/2007 |
| JP | 2011-151383 A | 8/2011 |

(Continued)

OTHER PUBLICATIONS

International Search Report (Application No. PCT/IB2020/057946) Dated Nov. 24, 2020.

(Continued)

*Primary Examiner* — Cheung Lee
(74) *Attorney, Agent, or Firm* — Husch Blackwell LLP

(57) ABSTRACT

A semiconductor device that occupies a small area is provided. The semiconductor device includes a first transistor including a first oxide semiconductor; a second transistor including a second oxide semiconductor; a capacitor element; a first insulator; and a first conductor in contact with a source or a drain of the second transistor. The capacitor element includes a second conductor, a third conductor, and a second insulator. The first transistor, the second transistor, and the first conductor are placed to be embedded in the first insulator. The second conductor is placed in contact with a top surface of the first conductor and a top surface of a gate (Continued)

of the first transistor. The second insulator is placed over the second conductor and the first insulator. The third conductor is placed to cover the second conductor with the second insulator therebetween.

11 Claims, 15 Drawing Sheets

(58) Field of Classification Search
CPC ..... H01L 27/127; H01L 29/423; H01L 29/49; H01L 29/4908; H01L 29/4958; H01L 29/66666; H01L 29/78642; H01L 29/78645; H01L 29/78648; H01L 29/7869; H01L 29/78696; H10B 12/00; H10B 12/03; H10B 12/033; H10B 12/0387; H10B 12/05
See application file for complete search history.

(56) References Cited

U.S. PATENT DOCUMENTS

| | | |
|---|---|---|
| 2007/0072439 A1 | 3/2007 | Akimoto et al. |
| 2011/0156027 A1 | 6/2011 | Yamazaki et al. |
| 2016/0172010 A1 | 6/2016 | Kato |
| 2016/0351243 A1 | 12/2016 | Ishizu et al. |
| 2017/0033111 A1 | 2/2017 | Yamazaki et al. |
| 2018/0129556 A1 | 5/2018 | Aoki et al. |
| 2020/0144310 A1 | 5/2020 | Onuki et al. |
| 2021/0013223 A1 | 1/2021 | Onuki et al. |

FOREIGN PATENT DOCUMENTS

| | | |
|---|---|---|
| JP | 2016-115385 A | 6/2016 |
| JP | 2016-115387 A | 6/2016 |
| JP | 2016-225617 A | 12/2016 |
| JP | 2018-081736 A | 5/2018 |
| JP | 2019-047020 A | 3/2019 |
| KR | 2016-0138910 A | 12/2016 |

OTHER PUBLICATIONS

Written Opinion (Application No. PCT/IB2020/057946) Dated Nov. 24, 2020.

FIG. 5A
| Amorphous | Intermediate state / New crystalline phase — Crystalline | Crystal |
|---|---|---|
| • completely amorphous | • CAAC<br>• nc<br>• CAC<br><br>excluding single crystal and poly crystal | • single crystal<br>• poly crystal |
FIG. 5B
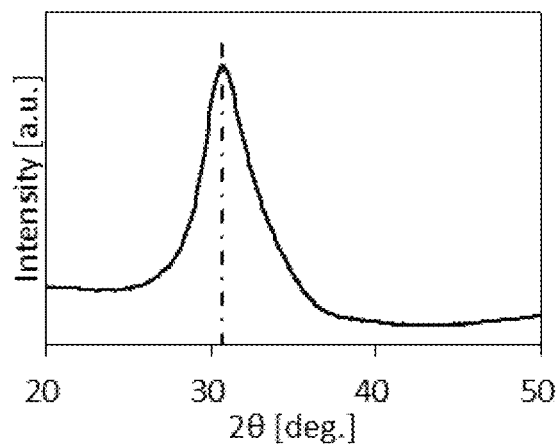
FIG. 5C
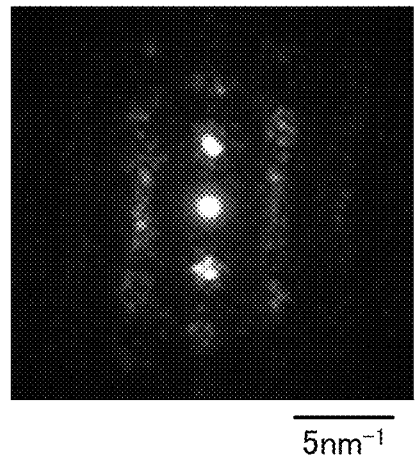

US 12,132,057 B2

SEMICONDUCTOR DEVICE WITH TRANSISTORS INCLUDING OXIDE SEMICONDUCTORS AND CAPACITOR ELEMENTS

This application is a 371 of international application PCT/IB2020/057946 filed on Aug. 26, 2020 which is incorporated herein by reference.

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, a memory device, an imaging device, a communication device, an electronic device, and the like may include a semiconductor element or a semiconductor circuit. A display device, a light-emitting device, a lighting device, an electro-optical device, a memory device, an imaging device, a communication device, an electronic device, and the like are referred to as a semiconductor device in some cases.

BACKGROUND ART

In recent years, transistors using oxide semiconductors or metal oxides in their channel formation regions (Oxide Semiconductor transistors, hereinafter referred to as OS transistors) have attracted attention (Patent Document 1).

The OS transistor has an extremely low off-state current. Patent Documents 2 and 3 each disclose a nonvolatile memory using an OS transistor utilizing such a feature. The nonvolatile memory using the OS transistor does not have a limit on the number of times of data rewriting and consumes low power in data rewriting. In addition, Patent Document 3 discloses an example where a memory cell of a nonvolatile memory is configured with only OS transistors.

Note that in this specification, the nonvolatile memory using the OS transistor is sometimes referred to as a NOSRAM (registered trademark). A NOSRAM is an abbreviation of "Nonvolatile Oxide Semiconductor RAM", which indicates a RAM including a gain cell (2T or 3T) memory cell.

REFERENCES

Patent Documents

[Patent Document 1] Japanese Published Patent Application No. 2007-123861
[Patent Document 2] Japanese Published Patent Application No. 2011-151383
[Patent Document 3] Japanese Published Patent Application No. 2016-115387

SUMMARY OF THE INVENTION

Problems to be Solved by the Invention

An object of one embodiment of the present invention is to provide a semiconductor device that occupies a small area. Another object of one embodiment of the present invention is to provide a semiconductor device that can be highly integrated. Another object of one embodiment of the present invention is to provide a semiconductor device with large storage capacity. Another object of one embodiment of the present invention is to provide a semiconductor device with low manufacturing cost. Another object of one embodiment of the present invention is to provide a highly reliable semiconductor device. Another object of one embodiment of the present invention is to provide a novel semiconductor device.

Note that the descriptions of these objects do not preclude the existence of other objects. One embodiment of the present invention does not necessarily achieve all of these objects. Other objects are apparent from the descriptions of the specification, the drawings, the claims, and the like, and other objects can be derived from the descriptions of the specification, the drawings, the claims, and the like.

Means for Solving the Problems

One embodiment of the present invention is a semiconductor device including a first transistor, a second transistor, a capacitor element, a first insulator, and a first conductor. The first transistor includes a first oxide semiconductor, a first gate, and a first gate insulator. The second transistor includes a second oxide semiconductor, a second gate, and a second gate insulator. The capacitor element includes a second conductor, a third conductor, and a second insulator. The first insulator is placed over the first oxide semiconductor and the second oxide semiconductor. In the first insulator, a first opening reaching the first oxide semiconductor is formed, a second opening reaching the second oxide semiconductor is formed, and a third opening reaching one of a source and a drain of the second transistor is formed. The first gate insulator and the first gate are placed in the first opening. The second gate insulator and the second gate are placed in the second opening. The first conductor is placed in the third opening. The second conductor is placed in contact with a top surface of the first conductor and a top surface of the first gate. The second insulator is placed over the second conductor and the first insulator. The third conductor is placed to cover the second conductor with the second insulator therebetween.

In the above, the second conductor is preferably placed to cover the first gate.

In the above, part of the first gate may be exposed from the second conductor and the part of the first gate may be in contact with the second insulator.

In the above, it is preferable that a channel length direction of the first transistor and a channel length direction of the second transistor be substantially parallel to each other. In the above, it is preferable that an extending direction of the third conductor be substantially perpendicular to the channel length direction of the first transistor In the above, it is preferable that a fourth conductor in contact with a top surface of the second gate be included and an extending direction of the fourth conductor be substantially perpendicular to the channel length direction of the second transistor. In the above, it is also preferable that the fourth conductor overlap the first oxide semiconductor with the first insulator therebetween.

One embodiment of the present invention is a semiconductor device including first to fourth transistors, a first oxide semiconductor, a second oxide semiconductor, a first capacitor element, a second capacitor element, a first insulator, a second insulator, a first conductor, and a second conductor. The first transistor and the third transistor are formed in the first oxide semiconductor. The second transistor and the fourth transistor are formed in the second oxide semiconductor. The first transistor includes a first gate and a first gate insulator. The second transistor includes a second gate and a second gate insulator. The third transistor includes a third gate and a third gate insulator. The fourth transistor includes a fourth gate and a fourth gate insulator. The first capacitor element includes a third conductor and a fourth conductor. The second capacitor element includes a fifth conductor and a sixth conductor. The first insulator is placed over the first oxide semiconductor and the second oxide semiconductor. In the first insulator, a first opening and a second opening each reaching the first oxide semiconductor are formed, a third opening and a fourth opening each reaching the second oxide semiconductor are formed, a fifth opening reaching one of a source and a drain of the second transistor is formed, and a sixth opening reaching one of a source and a drain of the fourth transistor is formed. The first gate insulator and the first gate are placed in the first opening. The third gate insulator and the third gate are placed in the second opening. The second gate insulator and the second gate are placed in the third opening. The fourth gate insulator and the fourth gate are placed in the fourth opening. The first conductor is placed in the fifth opening. The second conductor is placed in the sixth opening. The third conductor is placed in contact with a top surface of the first conductor and a top surface of the first gate. The fifth conductor is placed in contact with a top surface of the second conductor and a top surface of the third gate. The second insulator is placed over the third conductor, the fifth conductor, and the first insulator. The fourth conductor is placed to cover the third conductor with the second insulator therebetween. The sixth conductor is placed to cover the fifth conductor with the second insulator therebetween.

In the above, it is preferable that the first oxide semiconductor and the second oxide semiconductor each contain an element M (M is any one or more selected from gallium, aluminum, yttrium, and tin), and zinc.

Effect of the Invention

According to one embodiment of the present invention, a semiconductor device that occupies a small area can be provided. According to another embodiment of the present invention, a semiconductor device that can be highly integrated can be provided. According to another embodiment of the present invention, a semiconductor device with large storage capacity can be provided. According to another embodiment of the present invention, a semiconductor device with low manufacturing cost can be provided. According to another embodiment of the present invention, a highly reliable semiconductor device can be provided. According to another embodiment of the present invention, a novel semiconductor device can be provided.

Note that the descriptions of these effects do not preclude the existence of other effects. One embodiment of the present invention does not have to have all these effects. Other effects are apparent from the descriptions of the specification, the drawings, the claims, and the like and other effects can be derived from the descriptions of the specification, the drawings, the claims, and the like.

BRIEF DESCRIPTION OF THE DRAWINGS

FIG. 5A is a diagram showing a classification of crystal structures of IGZO. FIG. 5B is a diagram showing an XRD spectrum of a CAAC-IGZO film. FIG. 5C is a diagram showing nanobeam electron diffraction patterns of the CAAC-IGZO film.

MODE FOR CARRYING OUT THE INVENTION

Figure 1A:
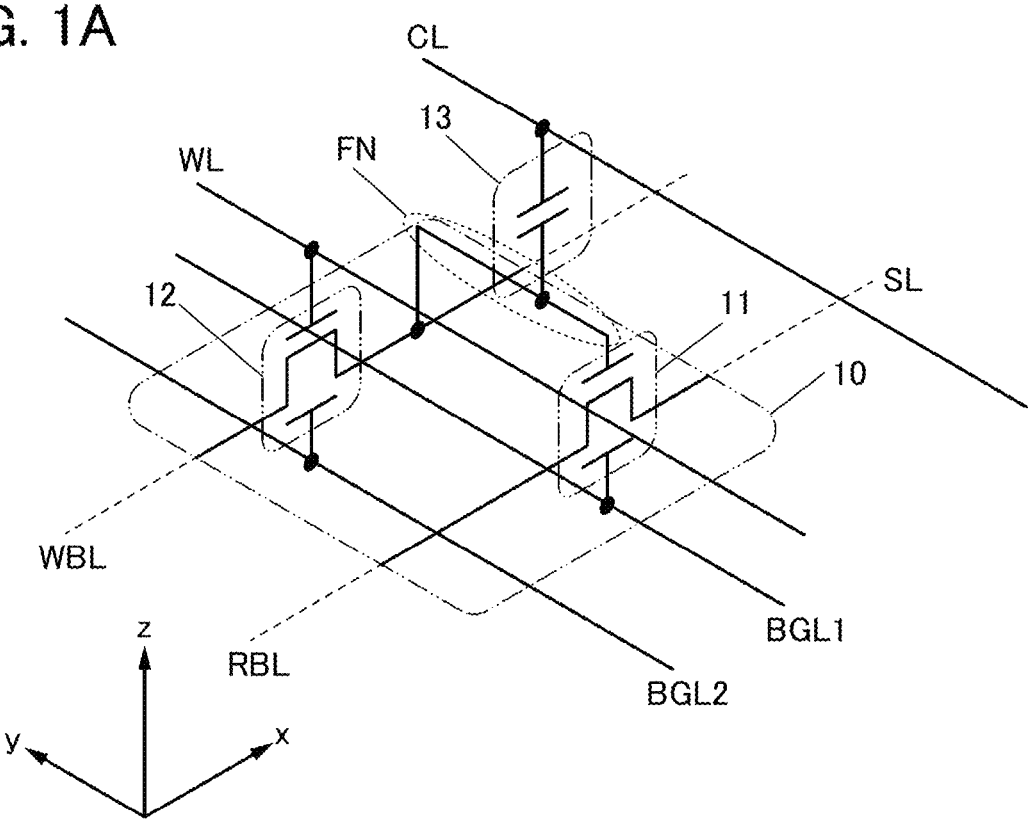
FIG. 1A is a circuit diagram of a semiconductor device of one embodiment of the present invention.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

The position, size, range, and the like of each component illustrated in the drawings and the like do not represent the actual position, size, range, and the like in some cases for easy understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which is not illustrated in some cases for easy understanding.

In the drawings and the like, some components might be omitted for easy understanding of the description.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs a current, inputs or outputs a voltage, or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed over and in direct contact with the insulating layer A, and does not exclude the case where another component is provided between the insulating layer A and the electrode B.

Furthermore, functions of a source and a drain might be switched depending on operation conditions, for example, when a transistor of opposite polarity is employed or a direction of current flow is changed in circuit operation; therefore, it is difficult to define which is a source or a drain. Thus, the terms "source" and "drain" can be interchanged with each other in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "identical", "the same", "equal", "uniform", and the like used in describing calculation values and actual measurement values allow for a margin of error of ±20% unless otherwise specified.

Voltage refers to a potential difference between a given potential and a reference potential (e.g., a ground potential or a source potential) in many cases. Therefore, "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" and an "insulator" can be replaced with each other. In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" and a "conductor" can be replaced with each other. In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. Furthermore, even when a term is provided with an ordinal number in this specification and the like, the ordinal number might be omitted in the scope of claims and the like.

Note that in this specification and the like, an "on state" of a transistor refers to a state where a source and a drain of the transistor are electrically short-circuited (also referred to as a "conduction state"). Furthermore, an "off state" of the transistor refers to a state where the source and the drain of the transistor are electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS", "L potential", or "L"). VSS refers to a power supply potential at a potential lower than VDD. A ground potential (hereinafter, also simply referred to as "GND" or "GND potential") can be used as VDD or VSS. For example, in the case where VDD is a ground potential, VSS is a potential lower than the ground potential, and in the case where VSS is a ground potential, VDD is a potential higher than the ground potential.

Unless otherwise specified, transistors described in this specification and the like are enhancement (normally-off) n-channel field-effect transistors. Thus, the threshold voltage (also referred to as "Vth") is higher than 0 V. Furthermore, unless otherwise specified, "an H potential is supplied to a gate of a transistor" means that "the transistor is brought into an on state" in some cases. Similarly, unless otherwise specified, "an L potential is supplied to a gate of a transistor" means that "the transistor is brought into an off state" in some cases In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

Moreover, in this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the potentials of a wiring, an electrode, and the like, "H" representing an H potential or "L" representing an L potential is sometimes written near the wiring, the electrode, and the like. In addition, enclosed "H" or "L" is sometimes written near a wiring, an electrode, and the like whose potential changes. Moreover, in the case where a transistor is in an off state, a symbol "x" is sometimes written on the transistor.

In general, a "capacitor" has a structure where two electrodes face each other with an insulator (dielectric) therebetween. This specification and the like include a case where a "capacitor element" is the above-described "capacitor". That is, this specification and the like include cases where a "capacitor element" is one having a structure where two electrodes face each other with an insulator therebetween, one having a structure where two wirings face each other with an insulator therebetween, or one where two wirings are positioned with an insulator therebetween.

In this specification and the like, when a plurality of components are denoted by the same reference signs, and in particular need to be distinguished from each other, an identification numeral such as "_1", "_2", "[n]", or "[m,n]" is sometimes added to the reference signs. For example, a second wiring CL is referred to as a wiring CL[2] in some cases.

A channel length refers to, for example, a distance between a source (a source region or a source electrode) and a drain (a drain region or a drain electrode) in a region where a semiconductor (or a portion where a current flows in a semiconductor when a transistor is in an on state) and a gate electrode overlap each other, or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, a length of a channel formation region in a direction perpendicular to the channel length direction in a region where a semiconductor (or a portion where a current flows in a semiconductor when a transistor is in an on state) and a gate electrode overlap each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, when a gate electrode covers a side surface of a semiconductor, the effective channel width is larger than the apparent channel width, and its influence cannot be ignored in some cases. For example, in a miniaturized transistor where a gate electrode covers a side surface of a semiconductor, the proportion of a channel formation region formed on the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % is regarded as an impurity. When an impurity is contained, for example, the density of defect states in a semiconductor increases and the crystallinity decreases in some cases. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, oxygen vacancies (also referred to as $V_O$) are formed in an oxide semiconductor in some cases by entry of impurities, for example.

Note that in this specification and the like, an oxynitride is a material that contains more oxygen than nitrogen in its composition. A nitride oxide is a material that contains more nitrogen than oxygen in its composition.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that a drain current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

In this embodiment, structures of a memory cell 10 that is an example of a semiconductor device of one embodiment of the present invention are described with reference to FIG. 1 to FIG. 8. The memory cell 10 functions as part of a memory device, includes a transistor 11, a transistor 12, and a capacitor element 13, and is electrically connected to a wiring CL, a wiring WL, a wiring RBL, a wiring SL, a wiring WBL, a wiring BGL1, and a wiring BGL2.

Figure 1B:
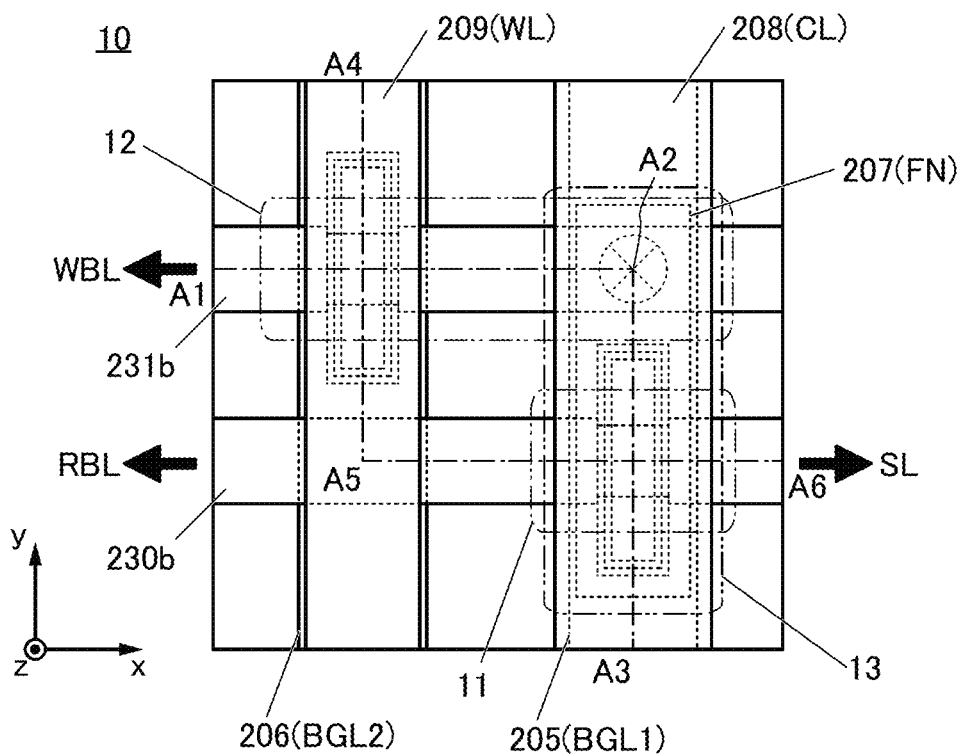
FIG. 1B is a top view of the semiconductor device of one embodiment of the present invention.
Figure 2A:
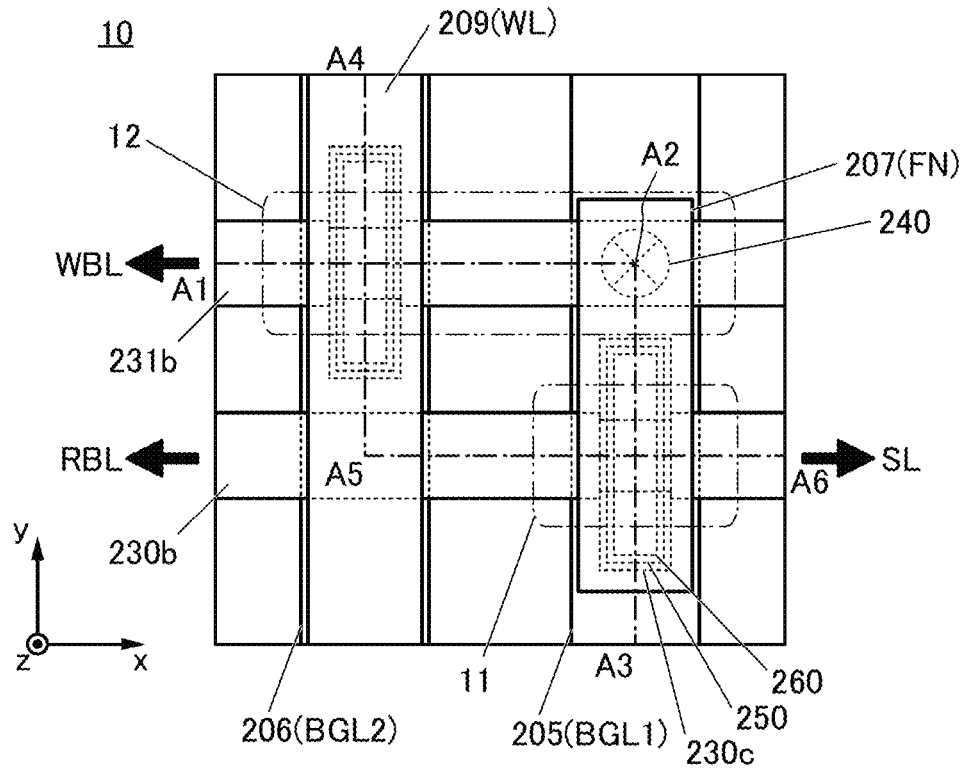
FIG. 2A and FIG. 2B are top views of a semiconductor device of one embodiment of the present invention.
Figure 2B:
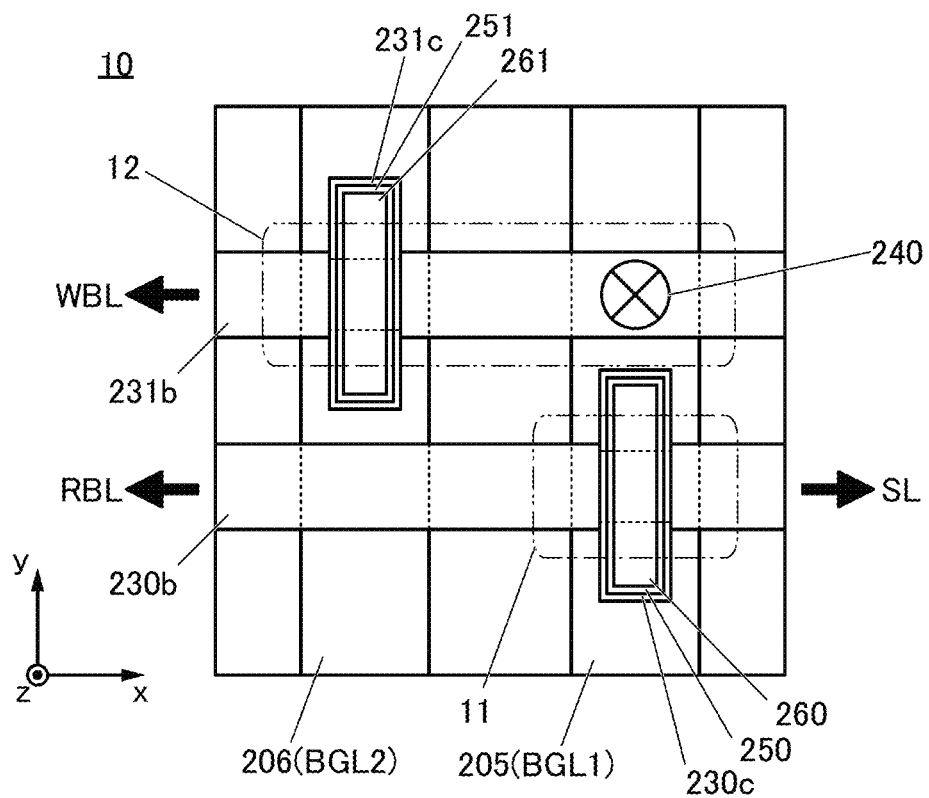

FIG. 1A is a circuit diagram of the memory cell 10, and FIG. 1B is a top view of the memory cell 10. FIG. 2A is a top view where the wiring CL is removed from FIG. 1B. FIG. 2B is a top view where the wiring CL, the wiring WL, a conductor 207, a dashed-dotted line A1-A2-A3, and a dashed-dotted line A4-A5-A6 are removed from FIG. 1B. Note that for clarity of the drawing, some components are omitted in the top views of FIG. 1B, FIG. 2A, and FIG. 2B.

Figure 3A:
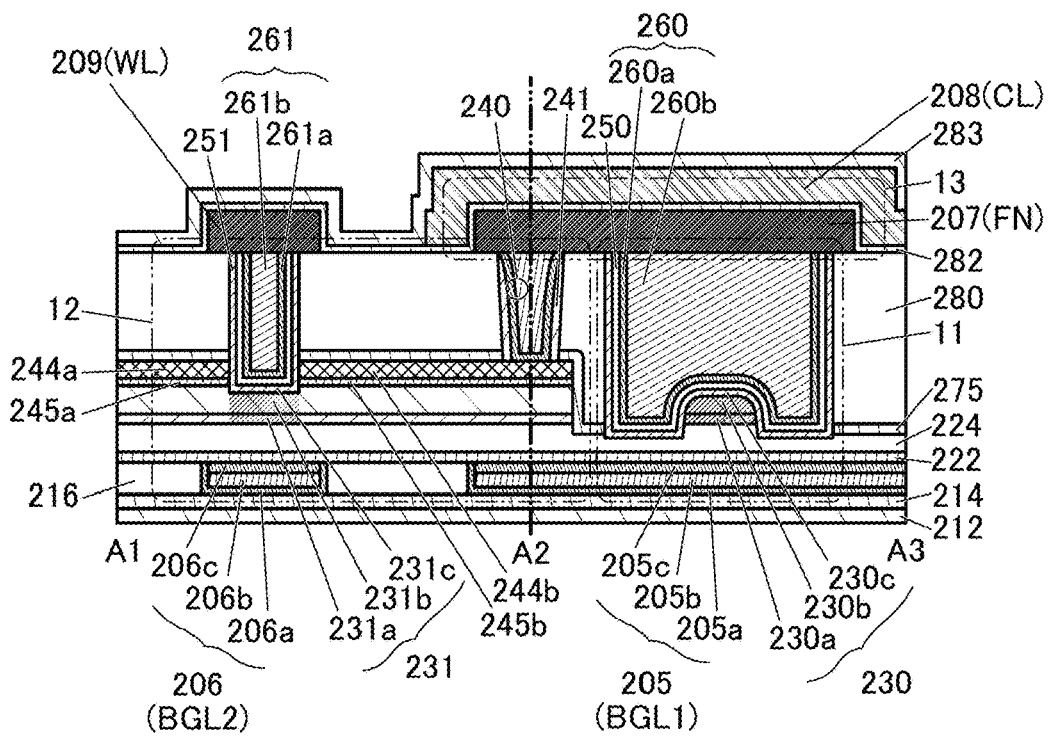
FIG. 3A and FIG. 3B are cross-sectional views of a semiconductor device of one embodiment of the present invention.
Figure 3B:
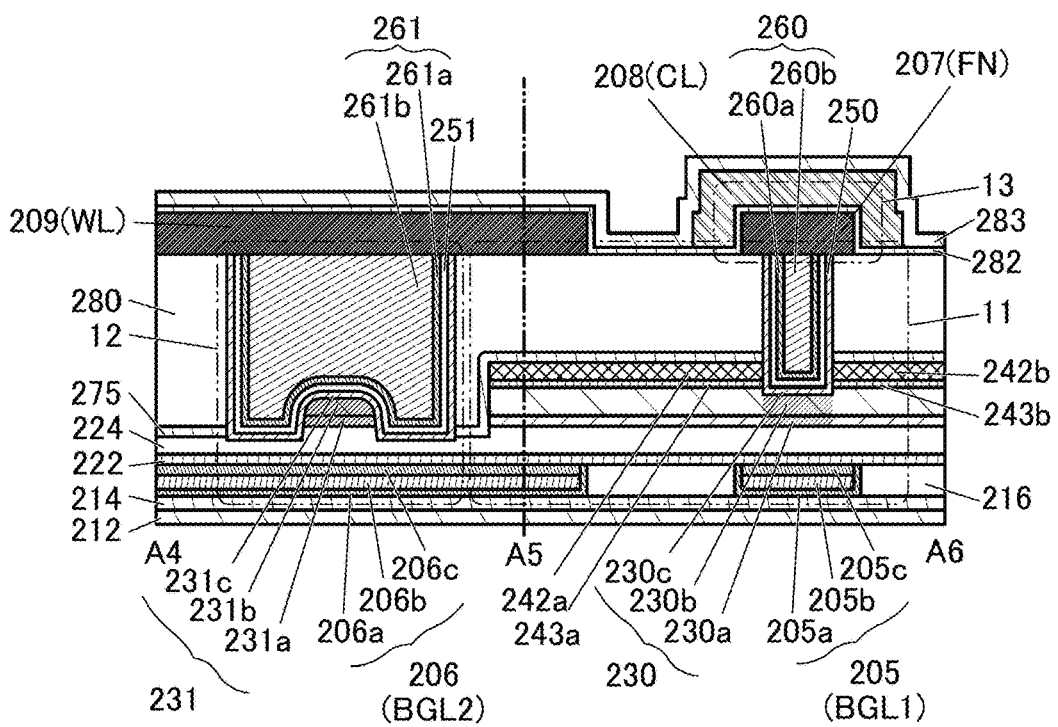

FIG. 3A is a cross-sectional view of a portion indicated by the dashed-dotted line A1-A2-A3 in FIG. 1B and FIG. 2A. Here, the cross-sectional view taken along A1-A2 is a cross-sectional view of the transistor 12 in the channel length direction, and the cross-sectional view taken along A2-A3 is a cross-sectional view of the transistor 11 in the channel width direction. FIG. 3B is a cross-sectional view of a portion indicated by the dashed-dotted line A4-A5-A6 in FIG. 1B and FIG. 2A. Here, the cross-sectional view taken along A4-A5 is a cross-sectional view of the transistor 12 in the channel width direction, and the cross-sectional view taken along A5-A6 is a cross-sectional view of the transistor 11 in the channel length direction.

Note that arrows indicating the x direction, the y direction, and the z direction are sometimes illustrated in the drawings. The x direction, the y direction, and the z direction are directions orthogonal to each other. In this specification and the like, one of the x direction, the y direction, and the z direction is referred to as a "first direction" in some cases. One of the other two directions is referred to as a "second direction" in some cases. The remaining one of the directions is referred to as a "third direction" in some cases.

Structure Example of Semiconductor Device

First, an example of a circuit structure of the memory cell 10 is described. As illustrated in FIG. 1A, the memory cell 10 includes the transistor 11, the transistor 12, and the capacitor element 13. One of a source and a drain of the transistor 11 is electrically connected to the wiring RBL, and the other thereof is electrically connected to the wiring SL. A back gate of the transistor 11 is electrically connected to the wiring BGL1. One of a source and a drain of the transistor 12 is electrically connected to the wiring WBL, and the other thereof is electrically connected to a gate of the transistor 11. Note that in this specification and the like, a node or a wiring that electrically connects the gate of the transistor 11 and the other of the source and the drain of the transistor 12 is referred to as a node FN in some cases. A gate of the transistor 12 is electrically connected to the wiring WL, and the back gate thereof is electrically connected to the wiring BGL2.

As illustrated in FIG. 1A, it is preferable that the transistor 11 and the transistor 12 be provided on the same plane and the capacitor element 13 be provided over the transistor 11 and the transistor 12. In other words, the capacitor element 13 is preferably placed to overlap the transistor 11 and the transistor 12 in the z-axis direction. With such a structure, the capacitor element 13 can be provided for the transistor 11 and the transistor 12 with almost no increase in area. Thus, the area occupied by the memory cell 10 can be made small. High integration of semiconductor devices is thus possible and a semiconductor device with large storage capacity can be provided. A semiconductor device with low manufacturing cost per storage capacity can be provided.

The wiring CL is placed over the capacitor element 13. Here, the wiring CL functions as an upper electrode of the capacitor element 13. Meanwhile, the node FN functions as a lower electrode of the capacitor element 13. That is, the capacitor element 13 forms a MIM (Metal-Insulator-Metal) capacitor. It can also be said that the memory cell 10 includes the capacitor element 13 between the node FN and the wiring CL.

The memory cell 10 has a function of storing data by retaining a potential (charge) written to the node FN. Specifically, the memory cell 10 supplies a potential that brings the transistor 12 into an on state to the wiring WL so that electrical continuity is established between the wiring WBL and the node FN. Accordingly, charge for setting the node FN at a predetermined potential is supplied to the node FN through the wiring WBL. After that, a potential for bringing the transistor 12 into an off state is supplied to the gate of the transistor 12. When the transistor 12 is brought into an off state, the charge written to the node FN is retained.

In the case of reading data stored in the memory cell 10, a constant potential (hereinafter sometimes referred to as a reading potential) is supplied to the wiring CL. When the reading potential is supplied to the wiring CL, the transistor 11 is brought into an on state or an off state in accordance with the potential written to the node FN. That is, the data stored in the node FN of the memory cell 10 can be read as the on state or the off state of the transistor 11.

For semiconductor layers of the transistor 12 and the transistor 11, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used.

Note that stacked semiconductor layers may be used in the transistor. In the case of stacking semiconductor layers, semiconductors having different crystal states may be used or different semiconductor materials may be used.

In particular, the transistor 12 is preferably an OS transistor. An oxide semiconductor has a band gap of 2 eV or more, and thus has an extremely low off-state current. When an OS transistor is used as the transistor 12, charge written to the node FN can be retained for a long time. Accordingly, capacitance required for the capacitor element 13 can be made small. Thus, when an OS transistor is used as the transistor 12, the area occupied by the capacitor element 13 can be made small. This makes it easy to place the capacitor element 13 over the transistor 11 and the transistor 12, leading to a reduction in the area occupied by the memory cell 10. In the case where an OS transistor is used as the transistor 12, the memory cell 10 can be referred to as an "OS memory".

The OS memory can retain written data for a period of one year or longer, or even 10 years or longer after power supply is stopped. Thus, the OS memory can be regarded as a nonvolatile memory.

In the OS memory, the amount of written charge is less likely to change over a long period of time; hence, the OS memory can retain multilevel (multibit) data as well as binary (1-bit) data.

In the OS memory, charge is written to the node through the OS transistor; hence, a high voltage, which a conventional flash memory requires, is unnecessary and high-speed write operation is possible. In addition, the OS memory does not require an erasing operation that is performed in flash memories before data rewriting. Furthermore, the OS memory does not perform charge injection and extraction to and from a floating gate or a charge-trap layer, allowing a substantially unlimited number of times of data writing and reading. The OS memory is less likely to degrade than a conventional flash memory and can have high reliability.

Furthermore, unlike a phase-change memory (PCM), a magnetoresistive random access memory (MRAM), a resistance random access memory (ReRAM), or the like, the OS memory has no structure change at an atomic level. Thus, the OS memory has higher rewrite endurance than a phase-change memory, a magnetoresistive random access memory, and a resistance random access memory.

The off-state current of the OS transistor hardly increases even in a high temperature environment. Specifically, the off-state current hardly increases even at an environment temperature higher than or equal to room temperature and lower than or equal to 200° C. In addition, the on-state current is less likely to decrease even in a high-temperature environment. A memory device including the OS memory achieves stable operation and high reliability even in a high temperature environment. Thus, in the case of forming the OS memory, the transistor 11 and the transistor 12 are preferably OS transistors. The OS transistor has a high withstand voltage between its source and drain. When OS transistors are used as transistors included in a semiconductor device, the semiconductor device achieves stable operation and high reliability even in a high temperature environment.

As illustrated in FIG. 3A, FIG. 3B, and the like, the memory cell 10 includes an insulator 212 over a substrate (not illustrated), an insulator 214 over the insulator 212, an insulator 216 over the insulator 214, an insulator 222 over the insulator 216, an insulator 224 over the insulator 222, an insulator 275 over the insulator 224, an insulator 280 over the insulator 275, an insulator 282 over the insulator 280, and an insulator 283 over the insulator 282. The insulator 212, the insulator 214, the insulator 216, the insulator 222, the insulator 224, the insulator 275, the insulator 280, the insulator 282, and the insulator 283 function as interlayer insulating films. The transistor 11 and the transistor 12 are provided in a layer between the insulator 214 and the insulator 282, and the capacitor element 13 is provided over the insulator 280. An opening reaching the other of the source and the drain of the transistor 12 is formed in the insulator 280 and the insulator 275, and the conductor 240 is provided to be embedded in the opening. Furthermore, an insulator 241 is preferably provided in contact with a side surface of the conductor 240.

The transistor 11 includes a conductor 205 (a conductor 205a, a conductor 205b, and a conductor 205c) placed to be embedded in the insulator 216; the insulator 222 over the insulator 216 and the conductor 205; the insulator 224 over the insulator 222; an oxide 230a over the insulator 224; an oxide 230b over the oxide 230a; an oxide 230c, an oxide 243a, and an oxide 243b over the oxide 230b; a conductor 242a over the oxide 243a; a conductor 242b over the oxide 243b; an insulator 250 over the oxide 230c; and a conductor 260 (a conductor 260a and a conductor 260b) that is positioned over the insulator 250 and overlaps part of the oxide 230b. Hereinafter, the oxide 230a, the oxide 230b, and the oxide 230c are sometimes collectively referred to as an oxide 230. The oxide 243a and the oxide 243b are sometimes collectively referred to as an oxide 243. The conductor 242a and the conductor 242b are sometimes collectively referred to as a conductor 242.

Here, the conductor 260 functions as a top gate, and the conductor 205 functions as a back gate (the wiring BGL1). The insulator 250 functions as a gate insulator of the top gate, and the insulator 222 and the insulator 224 function as a gate insulator of the back gate. The conductor 242a functions as one of the source and the drain, and the conductor 242b functions as the other of the source and the drain. A region of the oxide 230 which is overlapped by the conductor 260 functions as a channel formation region at least partly.

The insulator 275 covers the insulator 224, the oxide 230a, the oxide 230b, the oxide 243, and the conductor 242, and the insulator 280 is provided in contact with a top surface of the insulator 275. An opening reaching the oxide 230b and the insulator 224 is provided in the insulator 280 and the insulator 275, and the opening is provided to overlap a region between the conductor 242a and the conductor 242b.

As illustrated in FIG. 2B, FIG. 3A, and FIG. 3B, the oxide 230c, the insulator 250, and the conductor 260 are placed in the opening. Thus, the oxide 230c is provided in contact with a top surface of the insulator 224, a side surface of the oxide 230a, a top surface and side surface of the oxide 230b, side surfaces of the oxide 243a and the oxide 243b, side surfaces of the conductor 242a and the conductor 242b, a side surface of the insulator 275, and a side surface of the insulator 280. The insulator 250 is provided in contact with a top surface and side surface of the oxide 230c, and the conductor 260 is provided in contact with a top surface and side surface of the insulator 250. A top surface of the conductor 260, the uppermost portion of the insulator 250, and the uppermost portion of the oxide 230c are placed to be substantially aligned with a top surface of the insulator 280.

With such a structure, the conductor 260, the insulator 250, and the oxide 230c can be formed in a self-aligned manner to be embedded in the opening formed in the insulator 280 and the like. The formation of the conductor 260 and the like in this manner allows the conductor 260 to be placed in a region between the conductor 242a and the conductor 242b without alignment.

The transistor 12 includes a conductor 206 (a conductor 206a, a conductor 206b, and a conductor 206c) placed to be embedded in the insulator 216; the insulator 222 over the insulator 216 and the conductor 206; the insulator 224 over the insulator 222; an oxide 231a over the insulator 224; an oxide 231b over the oxide 231a; an oxide 231c, an oxide 245a, and an oxide 245b over the oxide 231b; a conductor 244a over the oxide 245a; a conductor 244b over the oxide 245b; an insulator 251 over the oxide 231c; and a conductor 261 (a conductor 261a and a conductor 261b) that is positioned over the insulator 251 and overlaps part of the oxide 231b. Hereinafter, the oxide 231a, the oxide 231b, and the oxide 231c are sometimes collectively referred to as an oxide 231. The oxide 245a and the oxide 245b are sometimes collectively referred to as an oxide 245. The conductor 244a and the conductor 244b are sometimes collectively referred to as a conductor 244.

Note that the transistor 12 has a structure similar to that of the transistor 11. Thus, the conductor 206, the oxide 231, the insulator 251, and the conductor 261 are formed in the same layer as and have structures similar to those of the conductor 205, the oxide 230, the insulator 250, and the conductor 260, respectively. Thus, the descriptions of the conductor 205, the oxide 230, the insulator 250, and the conductor 260 can be referred to for the conductor 206, the oxide 231, the insulator 251, and the conductor 261, respectively.

Here, the conductor 261 functions as a top gate, and the conductor 206 functions as a back gate (the wiring BGL2). The insulator 251 functions as a gate insulator of the top gate, and the insulator 222 and the insulator 224 function as a gate insulator of the back gate. The conductor 244a functions as one of the source and the drain, and the conductor 244b functions as the other of the source and the drain. A region of the oxide 231 which is overlapped by the conductor 261 functions as a channel formation region at least partly.

The insulator 275 covers the insulator 224, the oxide 231a, the oxide 231b, the oxide 245, and the conductor 244, and the insulator 280 is provided in contact with the top surface of the insulator 275. An opening reaching the oxide 231b and the insulator 224 is provided in the insulator 280 and the insulator 275, and the opening is provided to overlap a region between the conductor 244a and the conductor 244b.

As illustrated in FIG. 2B, FIG. 3A, and FIG. 3B, the oxide 231c, the insulator 251, and the conductor 261 are placed in the opening. Thus, the oxide 231c is provided in contact with the top surface of the insulator 224, a side surface of the oxide 231a, a top surface and side surface of the oxide 231b, side surfaces of the oxide 245a and the oxide 245b, side surfaces of the conductor 244a and the conductor 244b, a side surface of the insulator 275, and a side surface of the insulator 280. The insulator 251 is provided in contact with the top surface and side surface of the oxide 231c, and the conductor 261 is provided in contact with a top surface and side surface of the insulator 251. A top surface of the conductor 261, the uppermost portion of the insulator 251, and the uppermost portion of the oxide 231c are placed to be substantially aligned with the top surface of the insulator 280.

With such a structure, the conductor 261, the insulator 251, and the oxide 231c can be formed in a self-aligned manner to be embedded in the opening formed in the insulator 280 and the like. The formation of the conductor 261 and the like in this manner allows the conductor 261 to be placed in a region between the conductor 244a and the conductor 244b without alignment.

The capacitor element 13 includes the conductor 207 placed in contact with a top surface of the conductor 240 and the top surface of the conductor 260, the insulator 282 placed over the insulator 280 and the conductor 207, and a conductor 208 that is placed over the insulator 282 and overlaps the conductor 207 at least partly.

Here, the conductor 207 functions as the node FN, and the conductor 208 functions as the wiring CL. In other words, the conductor 207 functions as the lower electrode of the capacitor element 13, and the conductor 208 functions as the upper electrode of the capacitor element 13. The insulator 282 functions as a dielectric of the capacitor element 13.

As illustrated in FIG. 2A, the conductor 207 preferably includes the conductor 260 in a top view. In other words, the conductor 207 is preferably placed to cover the conductor 260. In the top view, the conductor 207 may also include the conductor 240. With such a structure, the capacitor element 13 can be placed to cover the top gate of the transistor 11 and to overlap the other of the source and the drain of the transistor 12. Thus, the capacitor element 13 with a large area can be provided for the transistor 11 and the transistor 12 with almost no increase in area.

As illustrated in FIG. 1B, FIG. 3A, and FIG. 3B, it is preferable that the insulator 282 be placed to cover the conductor 207 and the conductor 208 be placed to cover the conductor 207 with the insulator 282 therebetween. Thus, the conductor 208 is also placed along a side surface of the conductor 207 with the insulator 282 therebetween. Accordingly, the entire region where the conductor 208 and the conductor 207 overlap each other and the side surface of the conductor 207 can function as the capacitor element 13.

With the above structure, the capacitor element 13 can be provided while the area occupied by the memory cell 10 is made small. High integration of semiconductor devices is thus possible and a semiconductor device with large storage capacity can be provided. A semiconductor device with low manufacturing cost per storage capacity can be provided.

In addition, a conductor 209 is placed in contact with the top surface of the conductor 261. The conductor 209 can be formed in the same layer as the conductor 207 and is covered with the insulator 282. The conductor 209 functions as the wiring WL.

Note that a plurality of memory cells 10 arranged in a matrix can form a memory cell array. In this case, wirings that connect the memory cells 10 are preferably provided to extend in one direction. For example, as illustrated in FIG. 1A and FIG. 1B, the wiring CL (the conductor 208), the wiring WL (the conductor 209), the wiring BGL1 (the conductor 205), and the wiring BGL2 (the conductor 206) are provided to extend in the y direction. In this case, the memory cells 10 arranged in the y direction are connected to the wiring CL (the conductor 208), the wiring WL (the conductor 209), the wiring BGL1 (the conductor 205), and the wiring BGL2 (the conductor 206) to share the wirings.

When a structure is employed where the conductor 261 is provided to extend as the wiring WL, for example, a parasitic transistor is formed in a portion where the wiring WL and the oxide 230b overlap each other. Meanwhile, in this embodiment, the conductor 209 placed over the conductor 261 functions as the wiring WL. Thus, as illustrated in A5 in FIG. 3B, the conductor 209 and the oxide 230b overlap each other with the insulator 280 and the like therebetween. This can inhibit formation of a parasitic transistor in the portion where the conductor 209 and the oxide 230b overlap each other.

In the case where a plurality of memory cells 10 are arranged in the x direction, one of the source and the drain of the transistor 11 in the memory cell 10 is connected to the other of the source and the drain of the transistor 11 in the adjacent memory cell 10. Similarly, one of the source and the drain of the transistor 12 in the memory cell 10 is connected to the other of the source and the drain of the transistor 12 in the adjacent memory cell 10. That is, the sources and drains of a plurality of transistors 11 are connected in series, and the sources and drains of a plurality of transistors 12 are also connected in series. In other words, in the memory cells 10, one of the source and the drain of the transistor 12 is electrically connected to the wiring WBL through other transistors 12, one of the source and the drain of the transistor 11 is electrically connected to the wiring RBL through other transistors 11, and the other of the source and the drain of the transistor 11 is electrically connected to the wiring SL through other transistors 11.

In this case, the node FN of the memory cell 10 is connected to the other of the source and the drain of the transistor 12 in the memory cell 10 and one of the source and the drain of the transistor 12 in the adjacent memory cell 10. Thus, a potential (charge) written to the node FN can be retained by turning off the transistor 12 of the memory cell 10 and turning off the transistor 12 of the adjacent memory cell 10.

In the case of the above structure, the oxide 230b and the oxide 230a, and the oxide 231b and the oxide 231a are each provided to extend in the x direction as illustrated in FIG. 1B. Thus, the transistor 11 can be formed in a portion where the oxide 230b and the conductor 208 overlap each other, and the transistor 12 can be formed in a portion where the oxide 231b and the conductor 209 overlap each other. Here, the channel length direction of the transistor 11 and the channel length direction of the transistor 12 are substantially parallel to each other. The channel length direction of the transistor 11 and the extending direction of the conductor 208 are substantially perpendicular to each other. The channel length direction of the transistor 12 and the extending direction of the conductor 209 are substantially perpendicular to each other.

Like the oxide 230b, the oxide 243 and the conductor 242 are provided to extend in the x direction, except a region overlapped by the conductor 260 and removed. Like the oxide 231b, the oxide 245 and the conductor 244 are provided to extend in the x direction, except a region overlapped by the conductor 261 and removed.

Note that the structure of the memory cell 10 is not limited to the above. For example, the memory cell 10 may have a structure where the wiring RBL and the wiring SL are connected to the transistor 11 and the transistor 12 is connected to the wiring WBL. In this case, the oxide 230b, the oxide 231b, and the like are not provided to extend but patterned into an island-like shape in each memory cell 10. Thus, the potential (charge) written to the node FN can be retained only by turning off the transistor 12 of each memory cell 10.

The details of the memory cell array where the plurality of memory cells 10 are arranged in a matrix will be described in a later embodiment.

Figure 4:
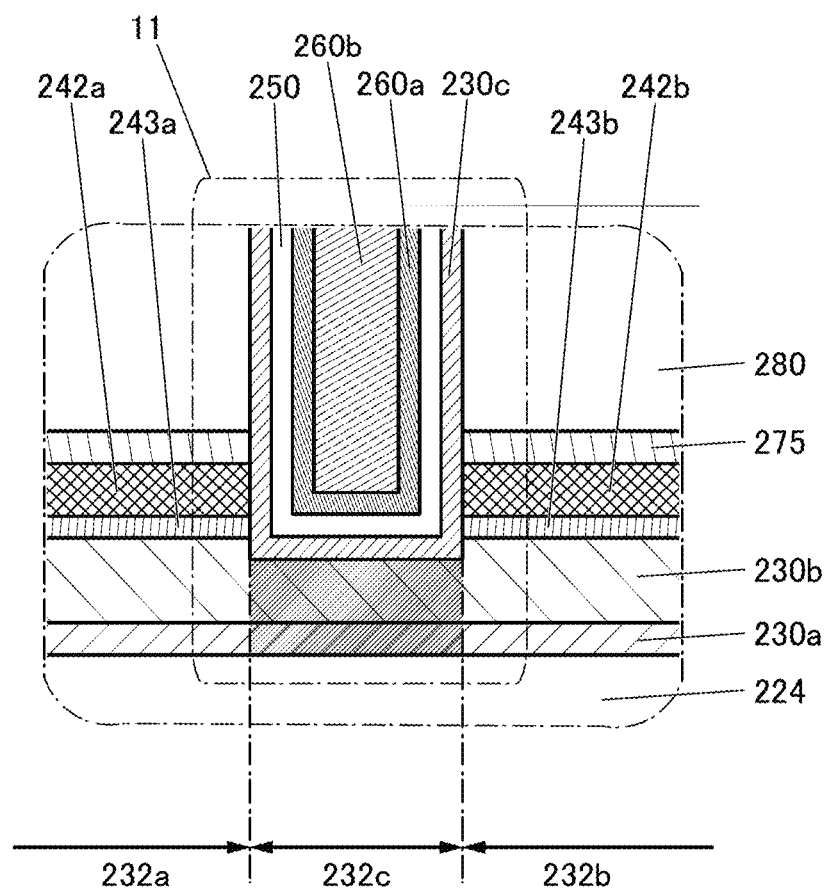
FIG. 4 is a cross-sectional view of a semiconductor device of one embodiment of the present invention.

Next, FIG. 4 illustrates an enlarged view of the vicinity of the channel formation region of the transistor 11 in FIG. 3B. Note that the oxide 230 of the transistor 11 is described below, and the description can be referred to for the oxide 231 of the transistor 12. As illustrated in FIG. 4, the oxide 230 includes a region 232c functioning as the channel formation region of the transistor 11, and a region 232a and a region 232b that are provided so as to sandwich the region 232c and function as the source region and the drain region of the transistor 11.

At least part of the region 232c is overlapped by the conductor 260. In other words, the region 232c is provided in a region between the conductor 242a and the conductor 242b. The region 232a is provided to be overlapped by the conductor 242a, and the region 232b is provided to be overlapped by the conductor 242b.

The region 232c functioning as the channel formation region is a high-resistance region with a low carrier concentration because it includes fewer oxygen vacancies or has a lower impurity concentration than the region 232a and the region 232b. Thus, the region 232c can be regarded as being i-type (intrinsic) or substantially i-type.

The region 232a and the region 232b functioning as the source region and the drain region are each a low-resistance region with an increased carrier concentration because it includes a large amount of oxygen vacancies or has a high concentration of an impurity such as hydrogen, nitrogen, or a metal element. In other words, the region 232a and the region 232b are each an n-type region having a higher carrier concentration and a lower resistance than the region 232c.

Here, the carrier concentration in the region 232c functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 232c functioning as the channel formation region is not particularly limited and can be, for example, $1 \times 10^{-9}$ cm$^{-3}$.

A region having a carrier concentration that is lower than or substantially equal to the carrier concentrations in the region 232a and the region 232b and higher than or substantially equal to the carrier concentration in the region 232c may be formed between the region 232c and the region 232a or the region 232b. That is, the region functions as a junction region between the region 232c and the region 232a or the region 232b. The hydrogen concentration in the junction region is sometimes lower than or substantially equal to the hydrogen concentrations in the region 232a and the region 232b and higher than or substantially equal to the hydrogen concentration in the region 232c. The amount of oxygen vacancies in the junction region is sometimes smaller than or substantially equal to the amount of oxygen vacancies in the region 232a and the region 232b and larger than or substantially equal to the amount of oxygen vacancies in the region 232c.

In the oxide 230, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 11, a metal oxide functioning as a semiconductor (hereinafter, also referred to as an oxide semiconductor) is preferably used in the oxide 230 including the channel formation region. The oxide 230 preferably includes the oxide 230a placed over the insulator 224, the oxide 230b placed over the oxide 230a, and the oxide 230c placed over the oxide 230b. The oxide 230 of the transistor 11 is describe below, and the description can be referred to for the oxide 231 of the transistor 12.

The metal oxide functioning as a semiconductor has a band gap of preferably 2 eV or more, further preferably 2.5 eV or more. With the use of a metal oxide having such a large band gap, the off-state current of the transistor can be reduced. With the use of a metal oxide having a large band gap, the off-state current of the transistor 11 and the transistor 12 can be reduced. In particular, a reduction in the off-state current of the transistor 12 enables long-term retention of stored content when the transistor 11 and the transistor 12 are used in a memory cell of a memory device. That is, the memory device does not require refresh operation or may have an extremely low frequency of the refresh operation. This leads to a sufficient reduction in the power consumption of the memory device.

As the oxide 230, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. For example, an In—Ga—Zn oxide is used as the oxide 230, and an oxide obtained by adding tin to an In—Ga—Zn oxide may be used. Alternatively, an In—Ga oxide, an In—Zn oxide, or an indium oxide may be used as the oxide 230.

The above metal oxide can be formed on a substrate by a sputtering method or the like. Hence, the transistor 11 and the transistor 12 can be provided to overlap a peripheral circuit such as a driver circuit formed on a silicon substrate. Thus, when the transistor 11 and the transistor 12 are used in a memory cell of the memory device, the area occupied by a memory cell array that can be provided in one chip can be increased, resulting in an increase in the storage capacity of the memory device. Furthermore, when a stack of a plurality of metal oxide films are formed, a stack of memory cell arrays can be provided. Thus, cells can be integrally arranged without increasing the area occupied by the memory cell arrays. That is, a stacked-layer structure body of memory cell arrays (hereinafter, sometimes referred to as a 3D cell array) can be formed. High integration of memory cells is thus possible and a semiconductor device with large storage capacity can be provided.

The formation method of the metal oxide is not limited to a sputtering method; a chemical vapor deposition (CVD) method, a molecular beam epitaxy (MBE) method, a pulsed laser deposition (PLD) method, an atomic layer deposition (ALD) method, or the like may be used as appropriate.

Here, the atomic ratio of In to the element M in the metal oxide used as the oxide 230b is preferably greater than the atomic ratio of In to the element M in the metal oxide used as the oxide 230a. As the oxide 230c, a metal oxide that can be used as the oxide 230b or a metal oxide that can be used as the oxide 230a is used.

Specifically, as the oxide 230a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 230b, a metal oxide with a composition of In:M:Zn=1:1:1 [atomic ratio] or in the neighborhood thereof, a composition of In:M:Zn=4:2:3 [atomic ratio] or in the neighborhood thereof, or a composition of In:M:Zn=5:1:3 [atomic ratio] or in the neighborhood thereof is used. Note that a composition in the neighborhood includes the range of ±30% of an intended atomic ratio. Gallium is preferably used as the element M.

When the metal oxide is formed by a sputtering method, the above atomic ratio is not limited to the atomic ratio of the formed metal oxide and may be the atomic ratio of a sputtering target used for forming the metal oxide.

Placing the oxide 230a under the oxide 230b can inhibit diffusion of impurities and oxygen into the oxide 230b from the components formed below the oxide 230a. Moreover, placing the oxide 230c over the oxide 230b can inhibit diffusion of impurities and oxygen into the oxide 230b from the components formed above the oxide 230c.

Note that the oxide 230 is not limited to have the structure where three layers of the oxide 230a, the oxide 230b, and the oxide 230c are stacked. For example, the oxide 230 may be a single layer of the oxide 230b, or may have a two-layer structure of the oxide 230a and the oxide 230b or a stacked-layer structure including four or more layers; alternatively, the oxide 230a, the oxide 230b, and the oxide 230c may each have a stacked-layer structure. For example, the oxide 230c may have a stacked-layer structure of two layers. In this case, a metal oxide that can be used as the oxide 230b is provided as the oxide 230c, and a metal oxide that can be used as the oxide 230a is provided thereover.

When the oxide 230a, the oxide 230b, and the oxide 230c contain a common element (as the main component) besides oxygen, the density of defect states at an interface between the oxide 230a and the oxide 230b and an interface between the oxide 230b and the oxide 230c can be made low. Since the density of defect states at the interface between the oxide 230a and the oxide 230b and the interface between the oxide 230b and the oxide 230c can be made low, the influence of interface scattering on carrier conduction is small, and a high on-state current can be obtained.

The conduction band minimum gradually changes at a junction portion of the oxide 230a and the oxide 230b and a junction portion of the oxide 230b and the oxide 230c. In other words, the conduction band minimum at the junction portion of the oxide 230a and the oxide 230b and the junction portion of the oxide 230b and the oxide 230c continuously changes or is continuously connected. To achieve this, the density of defect states in a mixed layer formed at the interface between the oxide 230a and the oxide 230b and the interface between the oxide 230b and the oxide 230c is preferably made low.

The oxide 230b preferably has crystallinity. It is particularly preferable to use a CAAC-OS (c-axis aligned crystalline oxide semiconductor) for the oxide 230b. The CAAC-OS may be used for the oxide 230a or the oxide 230c.

The CAAC-OS is a metal oxide having a dense structure with high crystallinity and a small amount of impurities or defects (oxygen vacancies ($V_O$) or the like). In particular, after the formation of a metal oxide, heat treatment is performed at a temperature at which the metal oxide does not become a polycrystal (e.g., higher than or equal to 400° C. and lower than equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a channel formation region of an oxide semiconductor, a transistor including the oxide semiconductor might have variable electrical characteristics and poor reliability. In addition, hydrogen in the vicinity of the oxygen vacancies enters the oxygen vacancies to form a defect (hereinafter, sometimes referred to as $V_O H$), so that an electron serving as a carrier might be generated even when no voltage is applied to a gate electrode of the transistor. Therefore, when the region of the oxide semiconductor where a channel is formed includes oxygen vacancies, the transistor tends to have normally-on characteristics (the characteristics with which, even when no voltage is applied to the gate electrode, the channel exits and a current flows through the transistor). Therefore, the impurities, oxygen vacancies, and $V_OH$ are preferably reduced as much as possible in the region of the oxide semiconductor where a channel is formed. In other words, the channel formation region in the oxide semiconductor preferably has a reduced carrier concentration to be an i-type (intrinsic) or substantially i-type region when no voltage is applied to the gate electrode of the transistor.

By contrast, when an insulator containing oxygen that is released by heating (hereinafter referred to as excess oxygen in some cases) is provided in the vicinity of the oxide semiconductor and heat treatment is performed, oxygen can be supplied from the insulator to the oxide semiconductor so as to reduce oxygen vacancies and $V_OH$. However, when an excess amount of oxygen is supplied to the source region or the drain region, the on-state current or field-effect mobility of the transistor 11 and the transistor 12 might be decreased. Furthermore, a variation in the amount of oxygen supplied to the source region or the drain region on the substrate plane leads to variable characteristics of the semiconductor device including the transistor.

Hence, the region 232c functioning as the channel formation region in the oxide semiconductor is preferably an i-type or substantially i-type region with a reduced carrier concentration, whereas the region 232a and the region 232b functioning as the source region and the drain region are preferably n-type regions with high carrier concentrations. That is, it is preferable that oxygen vacancies and $V_OH$ in the region 232c in the oxide semiconductor be reduced and the region 232a and the region 232b not be supplied with an excess amount of oxygen.

Thus, in this embodiment, microwave treatment is performed in an atmosphere containing oxygen in a state where the conductor 242a and the conductor 242b are provided over the oxide 230b so that oxygen vacancies and $V_OH$ in the region 232c are reduced. Here, the microwave treatment refers to, for example, treatment using an apparatus including a power source that generates high-density plasma with the use of a microwave. At the same time, the transistor 12 is also subjected to the microwave treatment in an atmosphere containing oxygen in a state where the conductor 244a and the conductor 244b are provided.

The microwave treatment in an atmosphere containing oxygen converts oxygen gas into plasma using a microwave or a high-frequency wave such as RF and activates the oxygen plasma. At this time, the region 232c can be irradiated with the microwave or the high-frequency wave such as RF. By the effect of the plasma, the microwave, or the like, $V_OH$ in the region 232c can be cut, hydrogen H can be removed from the region 232c, and an oxygen vacancy $V_O$ can be filled with oxygen. That is, the reaction "$V_OH \rightarrow H + V_O$" occurs in the region 232c, so that the hydrogen concentration in the region 232c can be reduced. As a result, oxygen vacancies and $V_OH$ in the region 232c can be reduced to lower the carrier concentration.

In the microwave treatment in an atmosphere containing oxygen, the microwave, the high-frequency wave such as RF, the oxygen plasma, or the like is blocked by the conductor 242a and the conductor 242b and does not affect the region 232a and the region 232b. Furthermore, the effect of the oxygen plasma can be reduced by the insulator 275 and the insulator 280 which are provided to cover the oxide 230b and the conductor 242. Hence, a reduction in $V_OH$ and supply of an excess amount of oxygen do not occur in the region 232a and the region 232b in the microwave treatment, preventing a decrease in carrier concentration.

In the above manner, oxygen vacancies and $V_OH$ can be selectively removed from the region 232c in the oxide semiconductor, whereby the region 232c can be an i-type or substantially i-type region. Furthermore, supply of an excess amount of oxygen to the region 232a and the region 232b functioning as the source region and the drain region can be inhibited and the n-type regions can be maintained. As a result, changes in the electrical characteristics of the transistor 11 can be inhibited, and thus in-plane variations in electrical characteristics of the transistors 11 can be inhibited. Note that similar effects can be obtained also in the case of the transistor 12.

With the above structure, the semiconductor device with a small variation in transistor characteristics can be provided. A semiconductor device having favorable electrical characteristics can be provided. A highly reliable semiconductor device can be provided.

A side surface of the opening where the conductor 260 and the like are embedded is substantially perpendicular to the formation surface of the oxide 230b including a groove portion of the oxide 230b in FIG. 3A, FIG. 3B, and the like; however, this embodiment is not limited thereto. For example, the opening may have a U-shape with a bottom portion having a moderate curve. For example, the side surface of the opening may be tilted with respect to the formation surface of the oxide 230b.

As illustrated in FIG. 3A, a curved surface may be provided between the side surface of the oxide 230b and the top surface of the oxide 230b in a cross-sectional view of the transistor 11 in the channel width direction. That is, an end portion of the side surface and an end portion of the top surface may be curved (such a shape is hereinafter also referred to as a rounded shape).

The radius of curvature of the curved surface is preferably greater than 0 nm and less than the thickness of the oxide 230b in a region overlapped by the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 230b with the insulator 250 and the conductor 260.

At least one of the insulator 212, the insulator 214, the insulator 275, the insulator 282, and the insulator 283 preferably functions as a barrier insulating film, which inhibits diffusion of impurities such as water and hydrogen from the substrate side or above the transistor 11 and the transistor 12 into the transistor 11 and the transistor 12. Thus, for at least one of the insulator 212, the insulator 214, the insulator 275, the insulator 282, and the insulator 283, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, or $NO_2$), or a copper atom (an insulating material through which the impurities are less likely to pass) is preferably used. Alternatively, it is preferable to use an insulating material having a function of inhibiting diffusion of oxygen (e.g., at least one of an oxygen atom, an oxygen molecule, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). Alternatively, a barrier property in this specification means a function of capturing and fixing (also referred to as gettering) a targeted substance.

Aluminum oxide, magnesium oxide, hafnium oxide, gallium oxide, indium gallium zinc oxide, silicon nitride, or silicon nitride oxide can be used for the insulator 212, the insulator 214, the insulator 275, the insulator 282, and the insulator 283, for example. For example, silicon nitride, which has a higher hydrogen barrier property, is preferably used for the insulator 212 and the insulator 283. For example, aluminum oxide or magnesium oxide, which has a function of capturing or fixing more hydrogen, is preferably used for the insulator 214, the insulator 275, and the insulator 282. Accordingly, impurities such as water and hydrogen can be inhibited from diffusing to the transistor 11 and the transistor 12 side from the substrate side through the insulator 212 and the insulator 214. Impurities such as water and hydrogen can be inhibited from diffusing to the transistor 11 and the transistor 12 side from an interlayer insulating film and the like which are provided above the insulator 283. Alternatively, oxygen contained in the insulator 224 or the like can be inhibited from diffusing to the substrate side through the insulator 212 and the insulator 214. Alternatively, oxygen contained in the insulator 280 and the like can be inhibited from diffusing to the components above the transistor 11 and the transistor 12 through the insulator 282 and the like. In this manner, it is preferable that the transistor 11 and the transistor 12 be surrounded with the insulator 212, the insulator 214, the insulator 275, the insulator 282, and the insulator 283, which have a function of inhibiting diffusion of oxygen and impurities such as water and hydrogen.

Here, in the case where aluminum oxide or the like is used for the insulator 212, the insulator 214, the insulator 275, the insulator 282, and the insulator 283, it is preferable to use an oxide having an amorphous structure. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used for the components of the transistor 11 and the transistor 12 or provided around the transistor 11 and the transistor 12, hydrogen contained in the transistor 11 and the transistor 12 or hydrogen existing around the transistor 11 and the transistor 12 can be captured or fixed. In particular, hydrogen contained in the channel formation regions of the transistor 11 and the transistor 12 is preferably captured or fixed. The metal oxide having an amorphous structure is used for the components of the transistor 11 and the transistor 12 or provided around the transistor 11 and the transistor 12, whereby the transistor 11, the transistor 12, and the semiconductor device with favorable characteristics and high reliability can be manufactured.

Although the insulator 212, the insulator 214, the insulator 275, the insulator 282, and the insulator 283 each preferably have an amorphous structure in the case of using aluminum oxide or the like, a region having a polycrystalline structure may be partly formed. Alternatively, the insulator 212, the insulator 214, the insulator 275, the insulator 282, and the insulator 283 may each have a multilayer structure where a layer having an amorphous structure and a layer having a polycrystalline structure are stacked. For example, a stacked-layer structure may be employed where a layer having a polycrystalline structure is formed over a layer having an amorphous structure.

The insulator 212, the insulator 214, the insulator 275, the insulator 282, and the insulator 283 can be formed by a sputtering method, for example. Since a sputtering method does not need to use hydrogen as a deposition gas, the hydrogen concentrations in the insulator 212, the insulator 214, the insulator 275, the insulator 282, and the insulator 283 can be reduced. The formation method is not limited to a sputtering method, and a CVD method, an MBE method, a PLD method, an ALD method, or the like can be used as appropriate.

The resistivities of the insulator 212 and the insulator 283 are preferably low in some cases. For example, by setting the resistivities of the insulator 212 and the insulator 283 to approximately $1 \times 10^{13}$ Ωcm, the insulator 212 and the insulator 283 can sometimes reduce charge up of the conductor 205, the conductor 242, or the conductor 260 in treatment using plasma or the like in the manufacturing process of a semiconductor device. The resistivities of the insulator 212 and the insulator 283 are preferably higher than or equal to $1 \times 10^{10}$ Ωcm and lower than or equal to $1 \times 10^{15}$ Ωcm.

The insulator 216 and the insulator 280 preferably have a lower permittivity than the insulator 214. When a material with a low permittivity is used for an interlayer film, parasitic capacitance generated between wirings can be reduced. For example, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide is used as appropriate for the insulator 216 and the insulator 280.

In the transistor 11, the conductor 205 is placed to overlap the oxide 230 and the conductor 260. As illustrated in FIG. 1B or the like, the conductor 205 can be provided to extend in the y direction. Here, the conductor 205 is preferably provided to be embedded in the opening formed in the insulator 216. Note that the conductor 205 of the transistor 11 is described below, and the description can be referred to for the conductor 206 of the transistor 12.

The conductor 205 includes the conductor 205a, the conductor 205b, and the conductor 205c. The conductor 205a is provided in contact with a bottom surface and a side wall of the opening. The conductor 205b is provided to be embedded in a recessed portion formed in the conductor 205a. Here, the top surface of the conductor 205b is lower in level than the top surface of the conductor 205a and the top surface of the insulator 216. The conductor 205c is provided in contact with the top surface of the conductor 205b and the side surface of the conductor 205a. Here, the top-surface level of the conductor 205c is substantially the same as the top-surface levels of the conductor 205a and the insulator 216. That is, the conductor 205b is surrounded by the conductor 205a and the conductor 205c.

Here, for the conductor 205a and the conductor 205c, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205a and the conductor 205c are formed using a conductive material having a function of inhibiting diffusion of hydrogen, impurities such as hydrogen contained in the conductor 205b can be prevented from diffusing into the oxide 230 through the insulator 224 and the like. When the conductor 205a and the conductor 205c are formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205a is a single layer or a stacked layer of the above conductive materials. For example, titanium nitride is used for the conductor 205a.

For the conductor 205b, a conductive material containing tungsten, copper, or aluminum as its main component is preferably used. For example, tungsten is used for the conductor 205b.

The conductor 205 sometimes functions as a back gate electrode. In that case, by changing the potential applied to the conductor 205 not in conjunction with but independently of the potential applied to the conductor 260, the threshold voltage (Vth) of the transistor 11 can be controlled. In particular, by applying a negative potential to the conductor 205, Vth of the transistor 11 can be further increased, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurity such as hydrogen contained in the insulator 216 can be reduced, inhibiting the diffusion of the impurity into the oxide 230.

As illustrated in FIG. 3A and FIG. 3B, the conductor 205 is preferably provided to be larger than a region of the oxide 230 is not overlapped by the conductor 242a or the conductor 242b. It is particularly preferable that the conductor 205 extend to a region beyond end portions of the oxide 230a and the oxide 230b that intersect with the channel width direction. That is, the conductor 205 and the conductor 260 preferably overlap each other with the insulators therebetween, in a region outside the side surface of the oxide 230 in the channel width direction. With this structure, the channel formation region of the oxide 230 can be electrically surrounded by the electric field of the conductor 260 functioning as the top gate electrode and the electric field of the conductor 205 functioning as the back gate electrode. In this specification, a transistor structure where a channel formation region is electrically surrounded by electric fields of a top gate and a back gate is referred to as a surrounded channel (S-channel) structure.

In this specification and the like, the S-channel transistor refers to a transistor having a structure where a channel formation region is electrically surrounded by electric fields of a pair of gate electrodes. The S-channel structure disclosed in this specification and the like is different from a Fin-type structure and a planar structure. With the S-channel structure, resistance to a short-channel effect can be enhanced, that is, a transistor where a short-channel effect is less likely to occur can be provided.

As illustrated in FIG. 1B or the like, the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Although the conductor 205a, the conductor 205b, and the conductor 205c are stacked as the conductor 205, the present invention is not limited to this structure. The conductor 205 may be provided to have a single-layer structure, a two-layer structure, or a stacked-layer structure of four or more layers. For example, when the conductor 205 has a stacked-layer structure of two layers, the top surface of the conductor 205a is aligned with the top surface of the conductor 205b without providing the conductor 205c.

The insulator 222 and the insulator 224 function as a gate insulator for the back gates of the transistor 11 and the transistor 12.

It is preferable that the insulator 222 have a function of inhibiting diffusion of hydrogen (e.g., at least one of a hydrogen atom, a hydrogen molecule, and the like). It is also preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

As the insulator 222, an insulator containing an oxide of one or both of aluminum and hafnium, which is an insulating material, is preferably used. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 and the oxide 231 to the substrate side and diffusion of impurities such as hydrogen from the periphery of the transistor 11 and the transistor 12 into the oxide 230 and the oxide 231. Thus, providing the insulator 222 can inhibit diffusion of impurities such as hydrogen into the transistor 11 and the transistor 12 and inhibit generation of oxygen vacancies in the oxide 230 and the oxide 231. Moreover, the conductor 205 and the conductor 206 can be inhibited from reacting with oxygen contained in the insulator 224, the oxide 230, and the oxide 231.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

For example, a single layer or stacked layers of an insulator containing what is called a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST), may be used for the insulator 222. With miniaturization and high integration of transistors, a problem such as a leakage current may arise because of a thinner gate insulator. When a high-k material is used for the insulator functioning as a gate insulator, a gate potential during operation of the transistor can be reduced while the physical thickness of the gate insulator is maintained.

It is preferable that the insulator 224 in contact with the oxide 230 and the oxide 231 contain excess oxygen (release oxygen by heating). For example, silicon oxide or silicon oxynitride is used as appropriate for the insulator 224. When an insulator containing oxygen is provided in contact with the oxide 230 and the oxide 231, oxygen vacancies in the oxide 230 and the oxide 231 can be reduced and the reliability of the transistor 11 and the transistor 12 can be improved.

For the insulator 224, specifically, an oxide material that releases oxygen by heating, in other words, an insulating material including an excess-oxygen region is preferably used. An oxide that releases oxygen by heating is an oxide film where the amount of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

In a manufacturing process of the transistor 11 and the transistor 12, the heat treatment is preferably performed with the surfaces of the oxide 230 and the oxide 231 exposed. The heat treatment is performed at higher than or equal to 100° C. and lower than or equal to 600° C., preferably higher than or equal to 350° C. and lower than or equal to 550° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230 and the oxide 231 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that oxygen adding treatment performed on the oxide 230 and the oxide 231 can promote a reaction where oxygen vacancies in the oxide 230 and the oxide 231 are repaired with supplied oxygen, i.e., a reaction of "$V_O$+ O→null". Furthermore, hydrogen remaining in the oxide 230 and the oxide 231 reacts with supplied oxygen, so that the hydrogen can be removed as $H_2O$ (dehydration can be caused). This can inhibit recombination of hydrogen remaining in the oxide 230 and the oxide 231 with oxygen vacancies and formation of $V_OH$.

Note that the insulator 222 and the insulator 224 may have a stacked-layer structure of two or more layers. In that case, without limitation to a stacked-layer structure formed of the same material, a stacked-layer structure formed of different materials may be employed. The insulator 224 may be formed into an island shape overlapping the oxide 230a and the oxide 231a. In this case, the insulator 275 is in contact with the side surface of the insulator 224 and the top surface of the insulator 222.

The oxide 243a and the oxide 243b are provided over the oxide 230b. The oxide 243a and the oxide 243b are provided to be apart from each other with the conductor 260 therebetween. Note that the oxide 243 of the transistor 11 is described below, and the description can be referred to for the oxide 245 of the transistor 12.

The oxide 243 (the oxide 243a and the oxide 243b) preferably has a function of inhibiting passage of oxygen. The oxide 243 having a function of inhibiting passage of oxygen is preferably provided between the oxide 230b and the conductor 242 functioning as the source electrode and the drain electrode, where case the electric resistance between the conductor 242 and the oxide 230b can be reduced. Such a structure can improve the electrical characteristics of the transistor 11 and the reliability of the transistor 11. In the case where the electric resistance between the conductor 242 and the oxide 230b can be sufficiently reduced, the oxide 243 is not necessarily provided.

A metal oxide containing the element M may be used as the oxide 243. In particular, aluminum, gallium, yttrium, or tin is preferably used as the element M. The concentration of the element M in the oxide 243 is preferably higher than that in the oxide 230b. Gallium oxide may be used for the oxide 243. Alternatively, a metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230b. The thickness of the oxide 243 is preferably greater than or equal to 0.5 nm and less than or equal to 5 nm, further preferably greater than or equal to 1 nm and less than or equal to 3 nm, still further preferably greater than or equal to 1 nm and less than or equal to 2 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can be inhibited in some cases.

It is preferable that the conductor 242a be provided in contact with the top surface of the oxide 243a and the conductor 242b be provided in contact with the top surface of the oxide 243b. The conductor 242a and the conductor 242b are aligned in the A5-A6 direction and provided to be apart from each other with the conductor 260 therebetween. Note that the conductor 242 of the transistor 11 is described below, and the description can be referred to for the conductor 244 of the transistor 12.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

Note that hydrogen contained in the oxide 230b or the like diffuses into the conductor 242a and the conductor 242b in some cases. In particular, when a nitride containing tantalum is used for the conductor 242a and the conductor 242b, hydrogen contained in the oxide 230b or the like is likely to diffuse into the conductor 242a and the conductor 242b, and the hydrogen that has diffused is bonded to nitrogen contained in the conductor 242a and the conductor 242b in some cases. That is, hydrogen contained in the oxide 230b or the like is absorbed by the conductor 242a and the conductor 242b in some cases.

No curved surface may be formed between the side surface of the conductor 242 and the top surface of the conductor 242. When no curved surface is formed in the conductor 242, the conductor 242 can have a large cross-sectional area in the channel width direction. This increases the conductivity of the conductor 242, so that the on-state current of the transistor 11 can be increased.

The insulator 275 is provided to cover the insulator 224, the oxide 230, the oxide 231, the oxide 243, the oxide 245, the conductor 242, and the conductor 244, and openings are formed in regions where the conductor 260, the conductor 261, the conductor 240, and the like are provided. The insulator 275 is preferably provided in contact with the top surface of the insulator 224, the side surface of the oxide 230, a side surface of the oxide 243, the side surface of the conductor 242, the top surface of the conductor 242, the side surface of the oxide 231, a side surface of the oxide 245, a side surface of the conductor 244, and a top surface of the conductor 244. The insulator 275 preferably functions as a barrier insulating film that inhibits passage of oxygen. The insulator 275 also preferably functions as a barrier insulating film that inhibits diffusion of impurities such as water and hydrogen into the insulator 224, the oxide 230, or the oxide 231 from above, and preferably has a function of capturing impurities such as hydrogen. As the insulator 275, an insulator such as aluminum oxide or silicon nitride is used, for example.

The insulator 275, which has a function of capturing impurities such as hydrogen, is provided in contact with the insulator 280 and the insulator 224 in a region interposed between the insulator 212 and the insulator 283, whereby impurities such as hydrogen contained in the insulator 280, the insulator 224, and the like can be captured and the amount of hydrogen in the region can be kept constant. In this case, aluminum oxide or the like is preferably used for the insulator 275.

Note that a barrier insulating film having a top-view shape similar to those of the conductor 242 and the conductor 244 may be provided between the insulator 275 and each of the conductor 242 and the conductor 244. An insulator that can be used as the insulator 275 can be used as the barrier insulating film.

The insulator 250 functions as a gate insulator of the top gate of the transistor 11. In the transistor 11, the insulator 250 is preferably placed to overlap the oxide 230b. The insulator 250 of the transistor 11 is describe below, and the description can be referred to for the insulator 251 of the transistor 12

For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride are preferable because they are thermally stable.

As for the insulator 250, the concentration of impurities such as water and hydrogen in the insulator 250 is preferably lowered as in the insulator 224. The thickness of the insulator 250 is preferably greater than or equal to 1 nm and less than or equal to 20 nm.

The insulator 250 is illustrated as a single layer in FIG. 3A and FIG. 3B, but may have a stacked-layer structure of two or more layers. In the case where the insulator 250 has a stacked-layer structure of two layers, it is preferable that a lower layer of the insulator 250 be formed using an insulator that releases oxygen by heating and an upper layer of the insulator 250 be formed using an insulator having a function of inhibiting diffusion of oxygen. With such a structure, oxygen contained in the lower layer of the insulator 250 can be inhibited from diffusing into the conductor 260. That is, a reduction in the amount of oxygen supplied to the oxide 230 can be inhibited. In addition, oxidation of the conductor 260 due to oxygen contained in the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high dielectric constant. The gate insulator having a stacked-layer structure of the lower layer of the insulator 250 and the upper layer of the insulator 250 can be thermally stable and can have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, for the upper layer of the insulator 250, a metal oxide containing one kind or two or more kinds selected from hafnium, aluminum, gallium, yttrium, zirconium, tungsten, titanium, tantalum, nickel, germanium, magnesium, and the like or a metal oxide that can be used as the oxide 230 can be used. In particular, an insulator containing an oxide of one or both of aluminum and hafnium is preferably used. For example, a stacked-layer structure including silicon oxide and hafnium oxide over the silicon oxide can be used as the insulator 250.

A metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. Moreover, oxidation of the conductor 260 due to oxygen in the insulator 250 can be inhibited.

Note that the metal oxide may have a function of part of the top gate electrode. For example, a metal oxide that can be used as the oxide 230 can be used as the metal oxide. In that case, when the conductor 260a is formed by a sputtering method, the metal oxide can have a reduced electric resistance to be a conductor. Such a conductor can be referred to as an OC (Oxide Conductor) electrode.

With the above metal oxide, the on-state current of the transistor 11 can be increased without a reduction in the influence of the electric field from the conductor 260. Since a distance between the conductor 260 and the oxide 230 is kept by the physical thicknesses of the insulator 250 and the metal oxide, a leakage current between the conductor 260 and the oxide 230 can be inhibited. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The conductor 260 functions as the top gate electrode of the transistor 11. In the transistor 11, the conductor 260 preferably includes the conductor 260a and the conductor 260b placed over the conductor 260a. The conductor 260 of the transistor 11 is describe below, and the description can be referred to for the conductor 261 of the transistor 12.

For example, the conductor 260a is preferably placed to cover a bottom surface and a side surface of the conductor 260b. Moreover, as illustrated in FIG. 3A and FIG. 3B, the top surface of the conductor 260 is substantially aligned with the uppermost portion of the insulator 250 and the uppermost portion of the oxide 230c. Note that the conductor 260 is illustrated to have a two-layer structure of the conductor 260a and the conductor 260b in FIG. 3A and FIG. 3B, but may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, it is possible to inhibit a reduction in conductivity of the conductor 260b due to oxidation caused by oxygen contained in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of the conductive material and titanium or titanium nitride may be employed.

As illustrated in FIG. 3A, in the channel width direction of the transistor 11, with reference to the bottom surface of the insulator 222, the level of the bottom surface of the conductor 260 in a region where the conductor 260 and the oxide 230b do not overlap each other is preferably lower than the level of the bottom surface of the oxide 230b. When the conductor 260 functioning as the gate electrode covers a side surface and a top surface of the channel formation region of the oxide 230b with the insulator 250 and the like therebetween, the electric field of the conductor 260 is likely to act on the entire channel formation region of the oxide 230b. Thus, the on-state current of the transistor 11 can be increased and the frequency characteristics can be improved. When the bottom surface of the insulator 222 is a reference, the difference between the level of the bottom surface of the conductor 260 in a region where the oxide 230a and the oxide 230b are not overlapped by the conductor 260 and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and openings are formed in regions where the conductor 260, the conductor 261, the conductor 240, and the like are provided. The top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. For example, silicon oxide and silicon oxynitride are preferable because of their thermal stability. Materials such as silicon oxide, silicon oxynitride, and porous silicon oxide are particularly preferable because a region containing oxygen released by heating can be easily formed.

Like the insulator 224, the insulator 280 preferably includes an excess-oxygen region or excess oxygen. The concentration of impurities such as water and hydrogen in the insulator 280 is preferably reduced. Oxide containing silicon such as silicon oxide, silicon oxynitride, or the like is used as appropriate for the insulator 280, for example. When an insulator containing excess oxygen is provided in contact with the oxide 230 and the oxide 231, oxygen vacancies in the oxide 230 and the oxide 231 can be reduced and the reliability of the transistor 11 and the transistor 12 can be improved.

A bottom surface of the conductor 240 provided between the transistor 12 and the capacitor element 13 is in contact with the conductor 244b, and the top surface is in contact with the conductor 207. Furthermore, the insulator 241 is preferably provided in contact with a side surface of the conductor 240 functioning as a plug.

The insulator 241 is provided in contact with the inner wall of the opening of the insulator 275 and the insulator 280, a first conductor of the conductor 240 is provided in contact with the side surface of the insulator 241, and a second conductor of the conductor 240 is provided on the inner side thereof. Note that although a structure where the first conductor of the conductor 240 and the second conductor of the conductor 240 are stacked is illustrated in FIG. 3A, the present invention is not limited thereto. For example, the conductor 240 may be provided as a single layer or to have a stacked-layer structure of three or more layers.

For the conductor 240, a conductive material containing tungsten, copper, or aluminum as its main component is preferably used. In addition, the conductor 240 may have a stacked-layer structure. In the case where the conductor 240 has a stacked-layer structure, a conductive material having a function of inhibiting passage of impurities such as water and hydrogen is preferably used for a conductor in contact with the insulator 275 and the insulator 280. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Thus, impurities such as water and hydrogen contained in the insulator 280 or the like can be inhibited from entering the oxide 231 through the conductor 240.

As the insulator 241, an insulator such as silicon nitride, aluminum oxide, or silicon nitride oxide may be used, for example. Since the insulator 241 is provided in contact with the insulator 275 and the insulator 280, impurities such as water and hydrogen contained in the insulator 280 or the like can be inhibited from entering the oxide 230 through the conductor 240. In particular, silicon nitride is suitable because of its high blocking property against hydrogen. Furthermore, oxygen contained in the insulator 280 can be prevented from being absorbed by the conductor 240.

The conductor 207 is provided in contact with the top surface of the conductor 240 and the top surface of the conductor 260. Here, the conductor 207 functions as the node FN. That is, the conductor 244b functioning as the other of the source and the drain of the transistor 12 is electrically connected to the conductor 260 functioning as the gate of the transistor 11 through the conductor 240 and the conductor 207.

In addition, in the same layer as the conductor 207, the conductor 209 is provided in contact with the top surface of the conductor 261. Here, the conductor 209 functions as the wiring WL.

The conductor 207 and the conductor 209 are formed by patterning the same conductive film. For the conductor 207 and the conductor 209, a conductive material containing tungsten, copper, or aluminum as its main component is preferably used. The conductor 207 and the conductor 209 may each have a stacked-layer structure, for example, may be stacked layers of titanium or titanium nitride and the above conductive material. Note that the conductor 207 and the conductor 209 may each be formed to be embedded in an opening formed in an insulator.

The insulator 282 is placed to cover the conductor 207 and the conductor 209 and to be in contact with the top surface of the insulator 280. The insulator 282 functions as the dielectric of the capacitor element 13, and thus is preferably formed using an insulator with a thin equivalent oxide thickness (EOT). For the insulator 282, it is possible to use aluminum oxide, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, or a nitride containing silicon and hafnium, for example. Note that in this specification and the like, the equivalent oxide thickness is a value obtained by converting the physical thickness of a film to the electrical thickness equivalent for silicon oxide or silicon oxynitride.

For example, when aluminum oxide with a dielectric constant of 8.5 is used as the insulator 282 and the area of the capacitor element 13 is 61800 $nm^2$, the capacitance value of the capacitor element 13 can be made greater than or equal to 0.9 fF by setting the thickness of the insulator 282 to less than or equal to 5 nm. Here, when the thickness of the insulator 282 is represented using the EOT with a dielectric constant set to 3.9, the thickness of the insulator 282 is 2.3 nm.

When the capacitance value of the capacitor element 13 is greater than or equal to 0.9 fF, which is sufficiently greater than the gate capacity of the transistor 12, data can be written to and read from the memory cell 10 sufficiently. That is, by setting the thickness of the insulator 282 to approximately 5 nm or less, the memory cell 10 can function as a memory device sufficiently.

The insulator 282 preferably functions as a barrier insulating film that inhibits impurities such as water and hydrogen from diffusing into the insulator 280 from above and preferably has a function of capturing impurities such as hydrogen. In addition, the insulator 282 preferably functions as a barrier insulating film that inhibits passage of oxygen. For the insulator 282, an insulator such as aluminum oxide can be used, for example. The insulator 282, which has a function of capturing impurities such as hydrogen, is provided in contact with the insulator 280 in a region interposed between the insulator 212 and the insulator 283, whereby impurities such as hydrogen contained in the insulator 280 and the like can be captured and the amount of hydrogen in the region can be kept constant.

The insulator 282 is preferably formed using a sputtering method. For example, the insulator 282 may be formed by a sputtering method in an atmosphere containing oxygen. When the insulator 282 is formed using a sputtering method, oxygen can be added to the insulator 280. Thus, oxygen contained in the insulator 280 can be supplied to the oxide 230 or the oxide 231 efficiently through the oxide 230c or the oxide 231c; hence, oxygen vacancies in the oxide 230 and the oxide 231 can be reduced and the electrical characteristics and the reliability of the transistor 11 and the transistor 12 can be improved. The formation method of the insulator 282 is not limited to a sputtering method; a CVD method, an MBE method, a PLD method, an ALD method, or the like may be used as appropriate.

The conductor 208 is provided over the insulator 282 so as to overlap the conductor 207 at least partly. Here, the conductor 208 functions as the wiring CL. For the conductor 208, a conductor that can be used for the conductor 209 or the like is used. The conductor 208 may be formed to be embedded in an opening provided in an insulator.

The insulator 283 is provided to cover the insulator 282 and the conductor 208. The insulator 283 functions as a barrier insulating film that inhibits impurities such as water and hydrogen from diffusing into the insulator 280 from above. The insulator 283 is preferably formed using a nitride containing silicon, such as silicon nitride or silicon nitride oxide. For example, silicon nitride deposited by a sputtering method is used for the insulator 283. When the insulator 283 is formed by a sputtering method, a high-density silicon nitride film where a void or the like is less likely to be formed can be obtained. As the insulator 283, a stack of silicon nitride deposited by a sputtering method and silicon nitride deposited thereover by a CVD method may be used.

<Constituent Material of Semiconductor Device>

Constituent materials that can be used for the semiconductor device are described below.

Note that insulators, conductors, and oxides described below can be formed using a sputtering method, a CVD method, an MBE method, a PLD method, an ALD method, or the like.

Note that the CVD method can be classified into a plasma-enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

As an ALD method, a thermal ALD method, where a precursor and a reactant react with each other only by a thermal energy, a PEALD (Plasma Enhanced ALD) method, where a reactant excited by plasma is used, and the like can be used.

<<Substrate>>

As a substrate where the transistor 11 and the transistor 12 are formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate that is any of the above semiconductor substrates including an insulator region, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor element, a resistor element, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as a leakage current may arise because of a thinner gate insulator. When a high-k material is used for the insulator functioning as a gate insulator, the voltage during operation of the transistor can be reduced while the physical thickness of the gate insulator is maintained. By contrast, when a material with a low dielectric constant is used for the insulator functioning as an interlayer film, parasitic capacitance generated between wirings can be reduced. Thus, a material is preferably selected depending on the function of the insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the electrical characteristics of the transistor can be stable. As the insulator having a function of inhibiting the passage of oxygen and impurities such as hydrogen, for example, a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed where silicon oxide or silicon oxynitride including a region containing oxygen released by heating is in contact with the oxide 230, oxygen vacancies contained in the oxide 230 can be compensated for.

<<Conductor>>

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In this case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is particularly preferable to use a conductive material containing oxygen and a metal element contained in the metal oxide where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used as the oxide 230 of the present invention will be described below.

The metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, the element M, and zinc is considered. The element M is one or more elements selected from aluminum, gallium, yttrium, and tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements may be used in combination as the element M in some cases.

Note that in this specification and the like, a metal oxide containing nitrogen is also collectively referred to as a metal oxide in some cases. A metal oxide containing nitrogen may be referred to as a metal oxynitride.

<Classification of Crystal Structure>

First, the classification of the crystal structures of an oxide semiconductor is described with reference to FIG. 5A. FIG. 5A is a diagram showing the classification of crystal structures of an oxide semiconductor, typically IGZO (a metal oxide containing In, Ga, and Zn).

As shown in FIG. 5A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 5A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. Here, FIG. 5B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 5B and obtained by GIXD measurement is hereinafter simply referred to as an XRD spectrum. Note that the CAAC-IGZO film shown in FIG. 5B has a composition in the neighborhood of In:Ga:Zn=4:2:3 [atomic ratio]. In addition, the thickness of the CAAC-IGZO film shown in FIG. 5B is 500 nm.

In FIG. 5B, the horizontal axis represents 2θ [deg.], and the vertical axis represents intensity [a.u.]. As shown in FIG. 5B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. Note that as shown in FIG. 5B, the peak at 2θ of around 31° is asymmetric with respect to the axis of an angle at which peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 5C shows a diffraction pattern of the CAAC-IGZO film. FIG. 5C shows a diffraction pattern observed by NBED where an electron beam is incident in a direction parallel to the substrate. Note that the CAAC-IGZO film shown in FIG. 5C has a composition in the neighborhood of In:Ga:Zn=4:2:3 [atomic ratio]. In the nanobeam electron diffraction method, electron diffraction is performed with a probe diameter of 1 nm.

As shown in FIG. 5C, a plurality of spots indicating c-axis alignment are observed in the diffraction pattern of the CAAC-IGZO film.

<<Structure of Oxide Semiconductor>>

Note that oxide semiconductors might be classified in a manner different from that in FIG. 5A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) where a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure where a clear grain boundary is observed is what is called polycrystal. It is highly probable that the grain boundary becomes a recombination center and captures carriers and thus decreases the on-state current and field-effect mobility of a transistor, for example. Thus, the CAAC-OS where no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity where no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material where elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state where one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition where materials are separated into a first region and a second region to form a mosaic pattern, and the first regions are distributed in the film (this composition is hereinafter also referred to as a cloud-like composition). That is, the CAC-OS is a composite metal oxide having a composition where the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] than the second region and lower [Ga] than the second region. Moreover, the second region has higher [Ga] than the first region and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure where the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a channel formation region of the transistor. For example, the carrier concentration in an oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor in the channel formation region and the concentration of silicon or carbon in the vicinity of an interface with the oxide semiconductor in the channel formation region (the concentrations obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor in the channel formation region, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor in the channel formation region, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor in the channel formation region is preferably reduced as much as possible. Specifically, the hydrogen concentration in the oxide semiconductor in the channel formation region, which is obtained by SIMS, is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, and yet still further preferably lower than $1\times10^{18}$ atoms/cm$^3$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

Modification Example of Semiconductor Device

An example of the semiconductor device that is one embodiment of the present invention is described below with reference to FIG. 6, FIG. 7A, FIG. 7B, FIG. 8A, and FIG. 8B.

Figure 6:
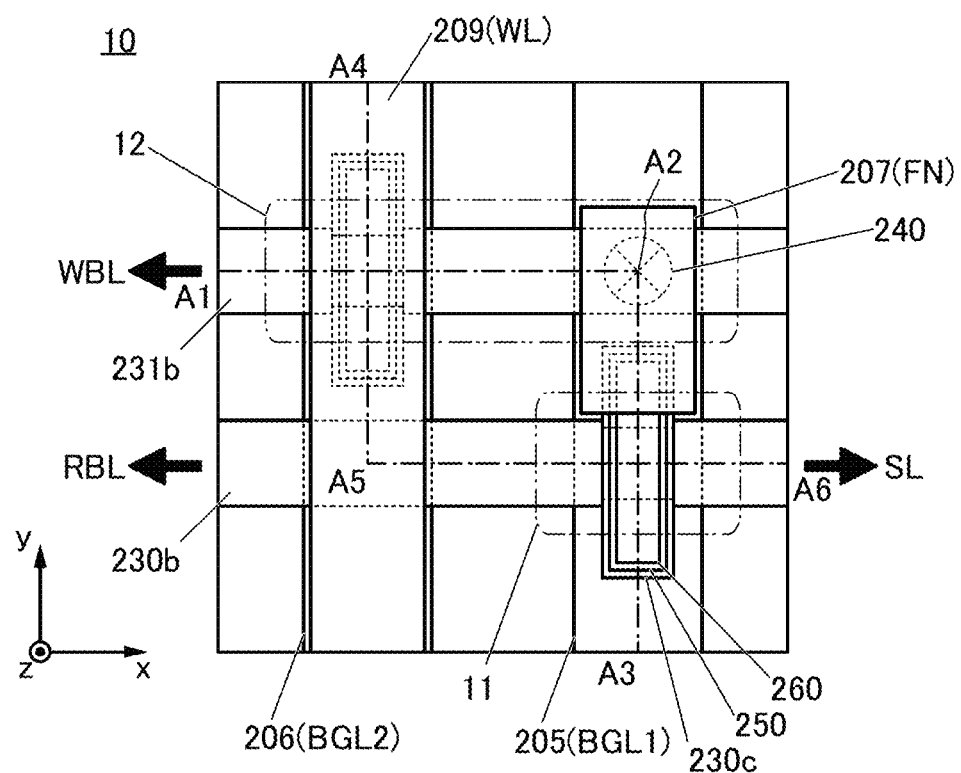
FIG. 6 is a top view of a semiconductor device of one embodiment of the present invention.
Figure 7A:
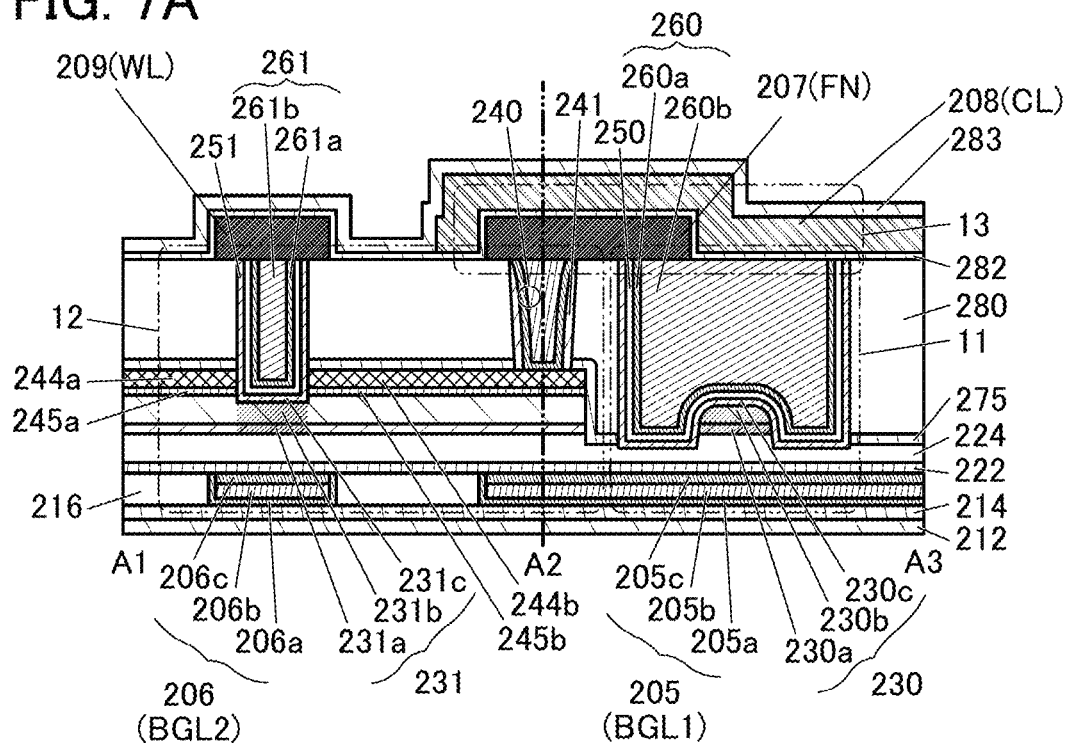
FIG. 7A and FIG. 7B are cross-sectional views of a semiconductor device of one embodiment of the present invention.
Figure 7B:
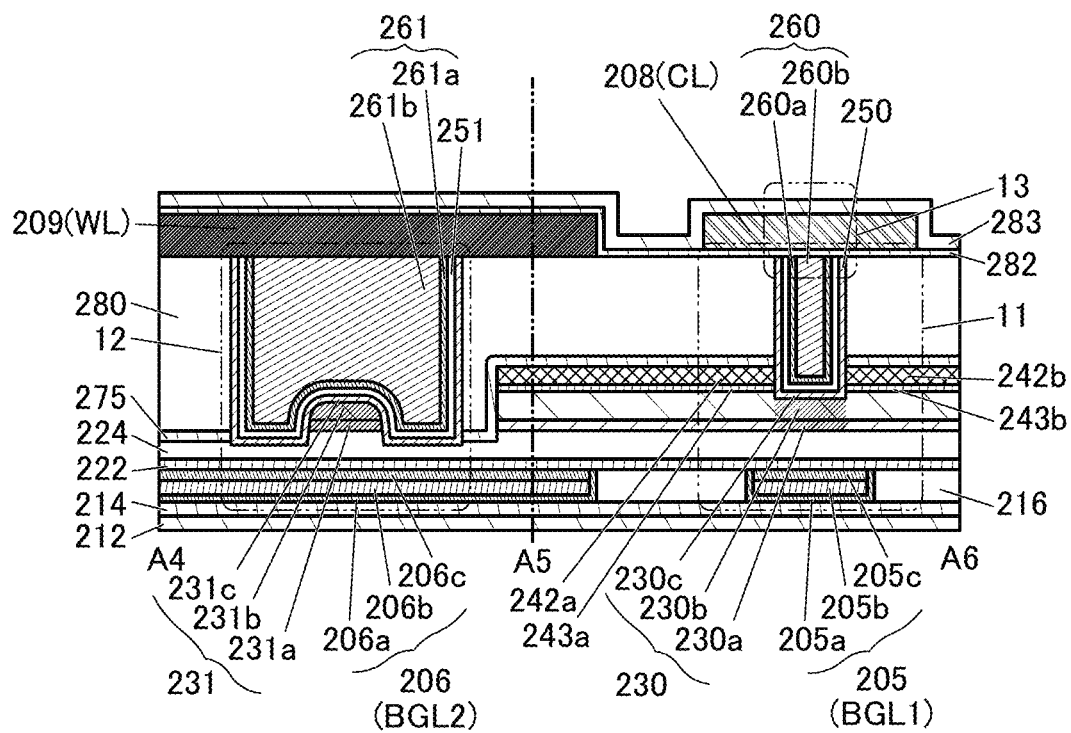

FIG. 6 is a top view of the memory cell 10. FIG. 7A is a cross-sectional view of a portion indicated by a dashed-dotted line A1-A2-A3 in FIG. 6. Here, the cross-sectional view taken along A1-A2 is a cross-sectional view of the transistor 12 in the channel length direction, and the cross-sectional view taken along A2-A3 is a cross-sectional view of the transistor 11 in the channel width direction. FIG. 7B is a cross-sectional view of a portion indicated by a dashed-dotted line A4-A5-A6 in FIG. 6. Here, the cross-sectional view taken along A4-A5 is a cross-sectional view of the transistor 12 in the channel width direction, and the cross-sectional view taken along A5-A6 is a cross-sectional view of the transistor 11 in the channel length direction. Note that for clarity of the drawing, some components (e.g., the wiring CL) are omitted in the top view of FIG. 6.

Note that in the semiconductor device illustrated in FIG. 6, FIG. 7A, and FIG. 7B, components having the same functions as the components included in the semiconductor device described in <Structure example 1 of semiconductor device> are denoted by the same reference numerals. In addition, the description in <Structure example of semiconductor device> can also be referred to for the components of the semiconductor device in this section.

The semiconductor device illustrated in FIG. 6, FIG. 7A, and FIG. 7B is a modification example of the semiconductor device illustrated in FIG. 1B, FIG. 2A, FIG. 2B, FIG. 3A, and FIG. 3B. The memory cell 10 illustrated in FIG. 6, FIG. 7A, and FIG. 7B is different from the memory cell 10 illustrated in FIG. 1B, FIG. 2A, FIG. 2B, FIG. 3A, and FIG. 3B in that part of the conductor 260 is exposed from the conductor 207.

Here, the part of the conductor 260 is in contact with the insulator 282. Thus, in the memory cell 10 illustrated in FIG. 6, FIG. 7A, and FIG. 7B, the conductor 207 and the conductor 260 function as a lower electrode of the capacitor element 13.

The region of the conductor 260 which is in contact with the insulator 282 includes a region overlapping the vicinity of the channel formation region of the transistor 11. That is, in the memory cell 10 illustrated in FIG. 6, FIG. 7A, and FIG. 7B, the insulator 282 is in contact with the insulator 280, the oxide 230c, the insulator 250, and the conductor 260 in the vicinity of a portion above the channel formation region of the transistor 11.

Such a structure enables a barrier insulating film against impurities such as water and hydrogen to be provided in the vicinity of the portion above of the channel formation region of the transistor 11, which effectively reduces diffusion of the impurities into the oxide 230 through the oxide 230c, the insulator 250, or the like. When the insulator 282 is formed by a sputtering method, oxygen can be added to a region of the insulator 280 which is closer to the channel formation region of the transistor 11. This enables efficient supply of oxygen contained in the insulator 280 to the oxide 230 through the oxide 230c or the insulator 250, leading to a reduction in oxygen vacancies in the oxide 230 and improvement in the electrical characteristics and reliability of the transistor 11.

Figure 8A:
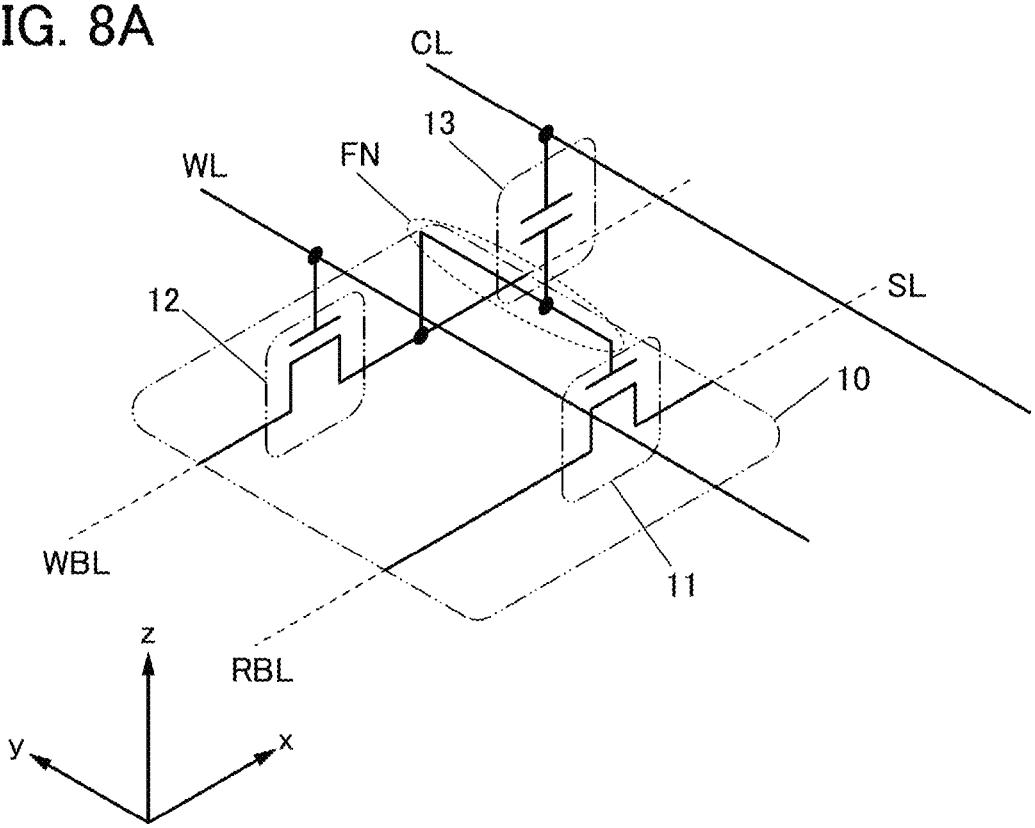
FIG. 8A and FIG. 8B are circuit diagrams of semiconductor devices of one embodiment of the present invention.
Figure 8B:
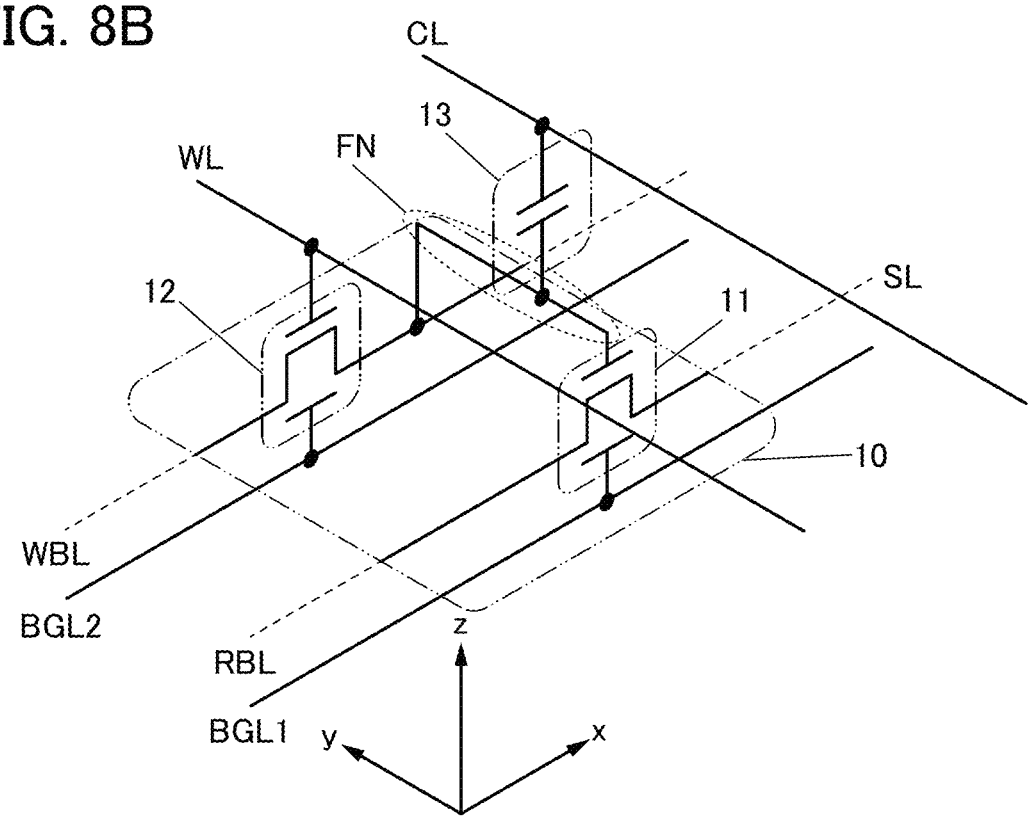

Although FIG. 1A and the like illustrate an example where the wiring BGL1 and the wiring BGL2 extend in the y direction, the semiconductor device of the present invention is not limited thereto. For example, a structure may be employed where each of the transistor 11 and the transistor 12 does not include a back gate as illustrated in FIG. 8A. Alternatively, for example, the wiring BGL1 and the wiring BGL2 may be provided to extend in the x direction as illustrated in FIG. 8B.

In addition, although FIG. 1A and the like illustrate an example where the wiring CL supplying a reading potential at the time of reading from the memory cell 10 is connected to the upper electrode of the capacitor element 13, the semiconductor device of the present invention is not limited thereto. For example, the wiring CL may be connected to the back gate electrode of the transistor 11. In this case, the low power supply potential VSS is supplied to the wiring connected to the upper electrode of the capacitor element 13. That is, the conductor 205 serves as the wiring CL supplying a reading potential at the time of reading from the memory cell 10, and the conductor 208 serves as the wiring supplied with the low power supply potential VSS.

According to one embodiment of the present invention, a semiconductor device that occupies a small area can be provided. According to another embodiment of the present invention, a semiconductor device that can be miniaturized or highly integrated can be provided. According to another embodiment of the present invention, a semiconductor device with large storage capacity can be provided. According to another embodiment of the present invention, a semiconductor device with low manufacturing cost can be provided. According to another embodiment of the present invention, a highly reliable semiconductor device can be provided. According to another embodiment of the present invention, a novel semiconductor device can be provided.

The structure, method, and the like described above in this embodiment can be used in an appropriate combination with other structures, methods, and the like described in this embodiment or the other embodiments.

Embodiment 2

This embodiment describes a structure example of a semiconductor device 500 including the memory cell 10 described in the above embodiment.

Figure 9A:
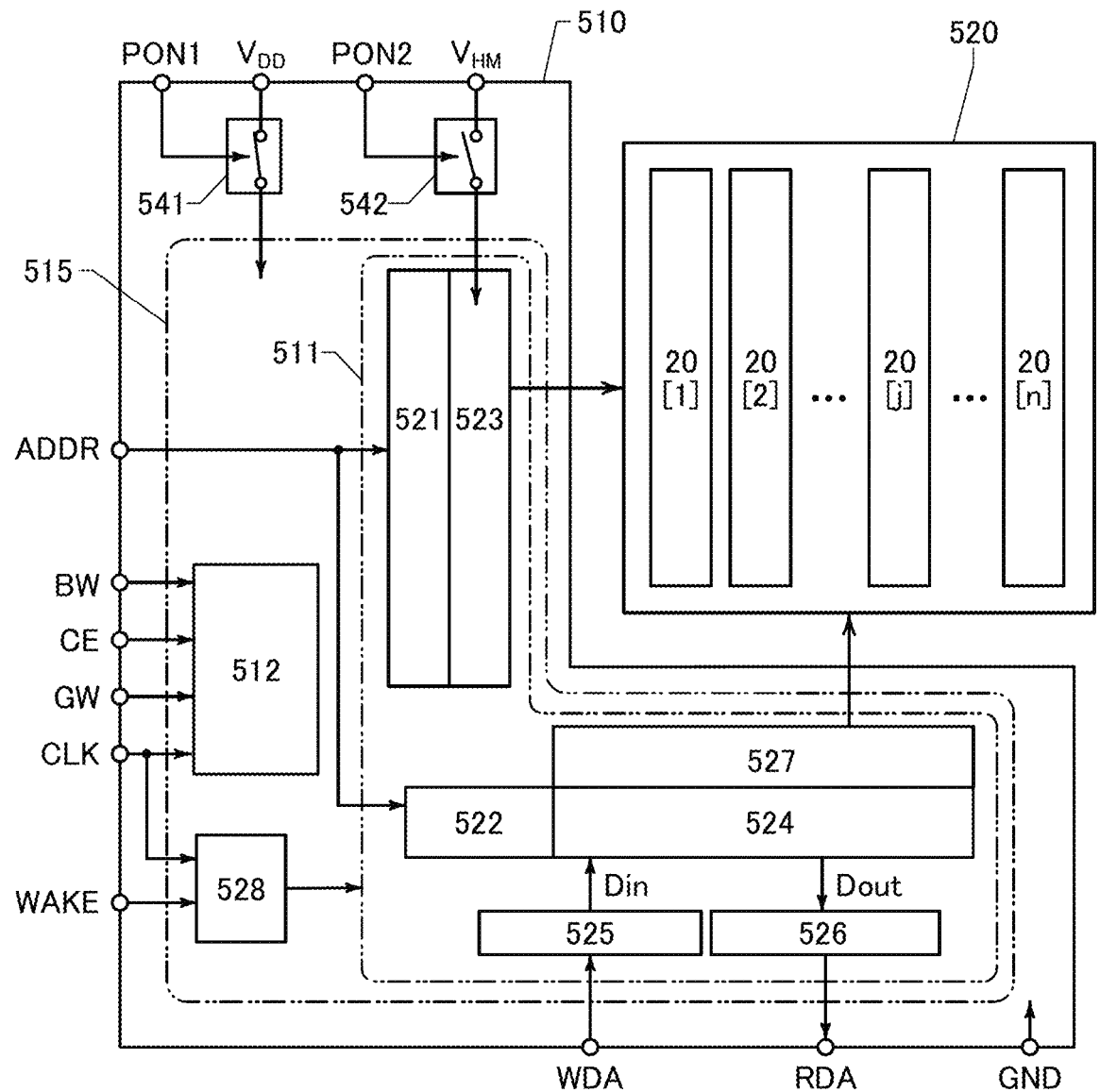
FIG. 9A is a block diagram illustrating a structure example of a semiconductor device of one embodiment of the present invention.

FIG. 9A is a block diagram illustrating the structure example of the semiconductor device 500 of one embodiment of the present invention. The semiconductor device 500 illustrated in FIG. 9A includes a driver circuit 510 and a memory cell array 520. The memory cell array 520 is a NAND memory cell array including a plurality of memory cell strings 20. Each memory cell string 20 includes a plurality of memory cells 10. FIG. 9A illustrates an example where the memory cell array 520 includes n (n is an integer of 2 or more) memory cell strings 20[1] to 20[n]. Note that the present invention is not limited thereto; for example, the memory cell array 520 may include a plurality of blocks each of which includes n memory cell strings 20.

The driver circuit 510 includes a PSW 541 (power switch), a PSW 542, and a peripheral circuit 515. The peripheral circuit 515 includes a peripheral circuit 511, a control circuit 512, and a voltage generation circuit 528.

In the semiconductor device 500, each circuit, each signal, and each voltage can be appropriately selected as needed. Alternatively, another circuit or another signal may be added. Signals BW, CE, GW, CLK, WAKE, ADDR, WDA, PON1, and PON2 are signals input from the outside, and a signal RDA is a signal output to the outside. The signal CLK is a clock signal.

The signals BW and CE and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signals PON1 and PON2 are power gating control signals. Note that the signals PON1 and PON2 may be generated in the control circuit 512.

The control circuit 512 is a logic circuit having a function of controlling the overall operation of the semiconductor device 500. For example, the control circuit 512 performs a logical operation on the signal CE, the signal GW, and the signal BW to determine an operation mode of the semiconductor device 500 (e.g., a writing operation or a reading operation). Alternatively, the control circuit 512 generates a control signal for the peripheral circuit 511 so that the operation mode is executed.

The voltage generation circuit 528 has a function of generating a negative voltage. The signal WAKE has a function of controlling the input of the signal CLK to the voltage generation circuit 528. For example, when an H-level signal is applied as the signal WAKE, the signal CLK is input to the voltage generation circuit 528, and the voltage generation circuit 528 generates a negative voltage.

The peripheral circuit 511 is a circuit for writing and reading data to/from the memory cell 10. The peripheral circuit 511 includes a row decoder 521, a column decoder 522, a row driver 523, a column driver 524, an input circuit 525, an output circuit 526, and a sense amplifier 527.

The row decoder 521 and the column decoder 522 have a function of decoding the signal ADDR. The row decoder 521 is a circuit for specifying a row to be accessed, and the column decoder 522 is a circuit for specifying a column to be accessed. The row driver 523 has a function of selecting the wiring WL specified by the row decoder 521. The column driver 524 has a function of writing data to the memory cell 10, a function of reading data from the memory cell 10, a function of retaining the read data, and the like.

The input circuit 525 has a function of retaining the signal WDA. Data retained by the input circuit 525 is output to the column driver 524. Data output from the input circuit 525 is data (Din) to be written to the memory cell 10. Data (Dout) read from the memory cell 10 by the column driver 524 is output to the output circuit 526. The output circuit 526 has a function of retaining Dout. In addition, the output circuit 526 has a function of outputting Dout to the outside of the semiconductor device 500. Data output from the output circuit 526 is the signal RDA.

The PSW 541 has a function of controlling supply of VDD to the peripheral circuit 515. The PSW 542 has a function of controlling supply of $V_{HM}$ to the row driver 523. Here, in the semiconductor device 500, a high power supply voltage is $V_{DD}$ and a low power supply voltage is GND (a ground potential). In addition, $V_{HM}$ is a high power supply voltage used to set the word line at a high level and is higher than $V_{DD}$. The on/off of the PSW 541 is controlled by the signal PON1, and the on/off of the PSW 542 is controlled by the signal PON2. The number of power domains to which $V_{DD}$ is supplied is one in the peripheral circuit 515 in FIG. 9A, but can be more than one. In this case, a power switch is provided for each power domain.

Figure 9B:
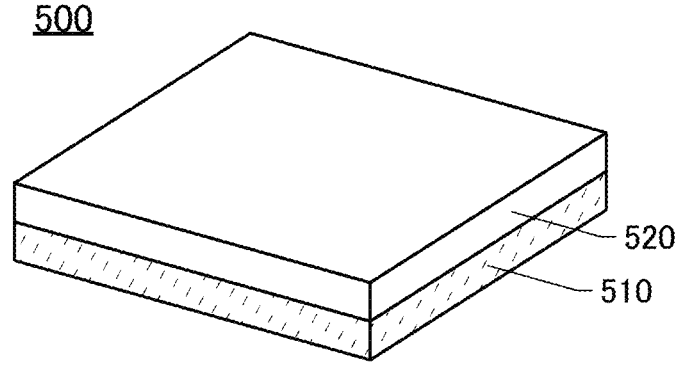
FIG. 9B is a perspective view illustrating the structure example of the semiconductor device of one embodiment of the present invention.

The driver circuit 510 and the memory cell array 520 may be provided on the same plane. Alternatively, as illustrated in FIG. 9B, the driver circuit 510 and the memory cell array 520 may be provided to overlap each other. Providing the driver circuit 510 and the memory cell array 520 to overlap each other can shorten a signal propagation distance. In addition, a reduction in size of the semiconductor device 500 can be realized.

Figure 10:
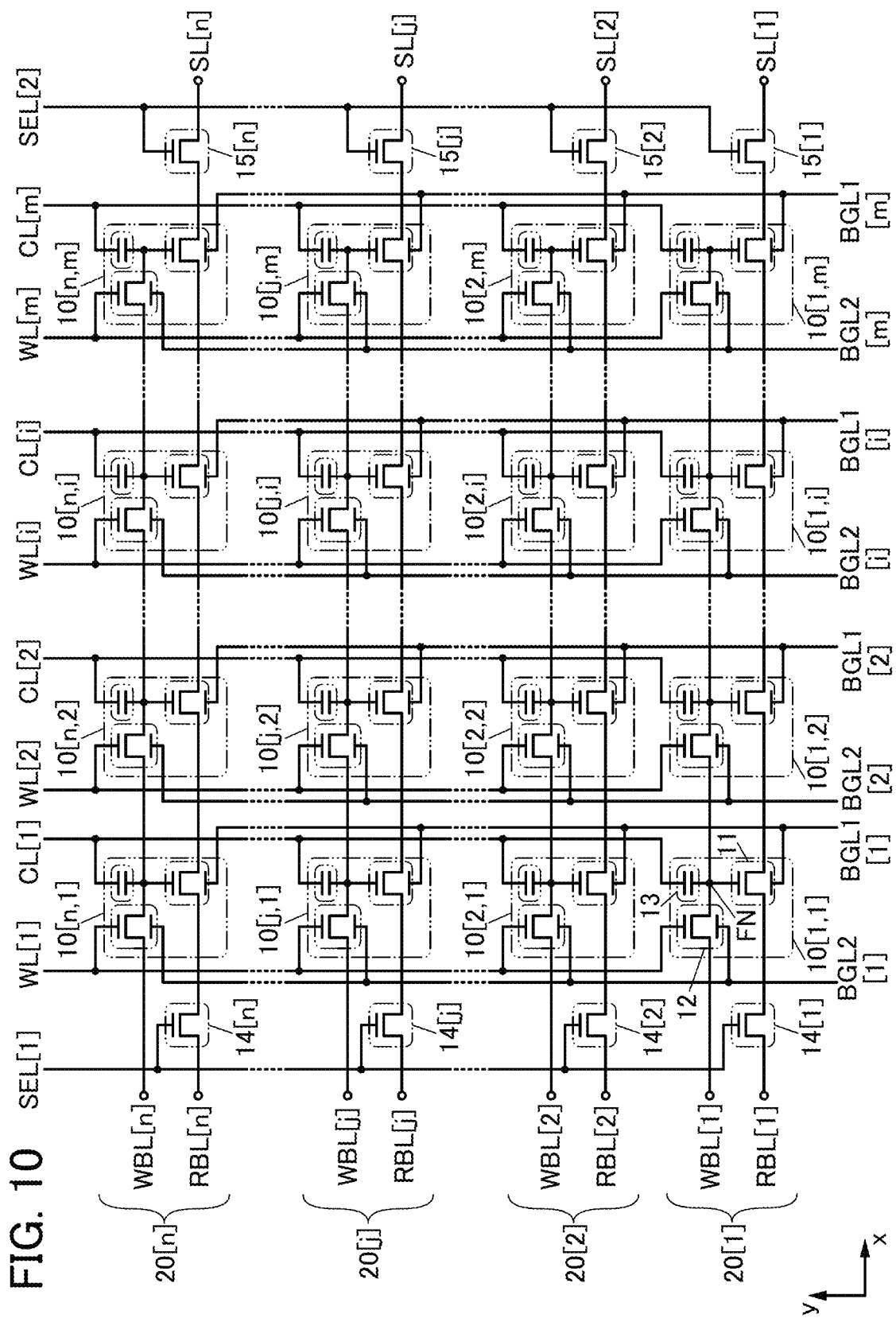
FIG. 10 is a circuit diagram of a memory cell array of one embodiment of the present invention.

FIG. 10 is a circuit diagram illustrating an arrangement example of the memory cells 10 of the memory cell array 520. The memory cell array 520 includes the n memory cell strings 20[1] to 20[n] extending in the x direction. Each memory cell string 20 includes m (m is an integer of 2 or more) memory cells 10 arranged in the x direction, a transistor 14, and a transistor 15. Thus, in the memory cell array 520, m×n memory cells 10 are arranged in a matrix of n rows and m columns. In addition, n transistors 14[1] to 14[n] and n transistors 15[1] to 15 [n] are each arranged in the y direction. Note that the circuit structure of each memory cell 10 is similar to the structure illustrated in FIG. 1A and wiring connection or the like is also similar to that of the structure; thus, the description in the above embodiment can be referred to.

In each memory cell string 20, the sources and drains of a plurality of transistors 11 are connected in series, and the sources and drains of a plurality of transistors 12 are also connected in series. At one end portion of each memory cell string 20, one of the source and the drain of the transistor 11 is electrically connected to one of a source and a drain of the transistor 14. At the other end portion of each memory cell string 20, the other of the source and the drain of the transistor 11 is electrically connected to one of a source and a drain of the transistor 15.

In FIG. 10, the memory cell 10 in the first row and the first column is denoted by the memory cell 10[1,1], and the memory cell 10 in the n-th row and the m-th column is denoted by the memory cell 10[n,m]. The memory cell 10 in the j-th row and the i-th column (j is an integer greater than or equal to 1 and less than or equal to n, and i is an integer greater than or equal to 1 and less than or equal to m) is denoted by the memory cell 10[j,i].

Note that the rows and the columns extend in directions orthogonal to each other. Although the x direction is "row" and the y direction is "column" in this embodiment, the x direction may be "column" and the y direction may be "row".

The memory cell array 520 includes m wirings CL[1] to CL[m] extending in the y direction, m wirings WL[1] to WL[m] extending in the y direction, m wirings BGL1[1] to BGL1[m] extending in the y direction, m wirings BGL2[1] to BGL2[m] extending in the y direction, and two wirings SEL[1] and SEL[2] extending in the y direction. Here, the wiring SEL[1] is electrically connected to gates of the transistor 14[1] to the transistor 14[n], and the wiring SEL[2] is electrically connected to gates of the transistor 15[1] to the transistor 15[n].

The memory cell array 520 includes n wirings RBL[1] to RBL[n], n wirings SL[1] to SL[n], and n wirings WBL[1] to WBL[n]. In each memory cell string 20, the wiring WBL is electrically connected to the transistor 12 at the one end portion, the wiring RBL is electrically connected to the transistor 14 at the one end portion, and the wiring SL is electrically connected to the transistor 15 at the other end portion.

For example, in the memory cell string 20[1], the wiring RBL[1] is electrically connected to one of the source and the drain of the transistor 11 of the memory cell 10[1,1] through the transistor 14[1]. The wiring SL[1] is electrically connected to the other of the source and the drain of the transistor 11 of the memory cell 10[1,m] through the transistor 15[1]. The wiring WBL[1] is electrically connected one of the source and the drain of the transistor 12 of the memory cell 10[1,1].

Figure 11:
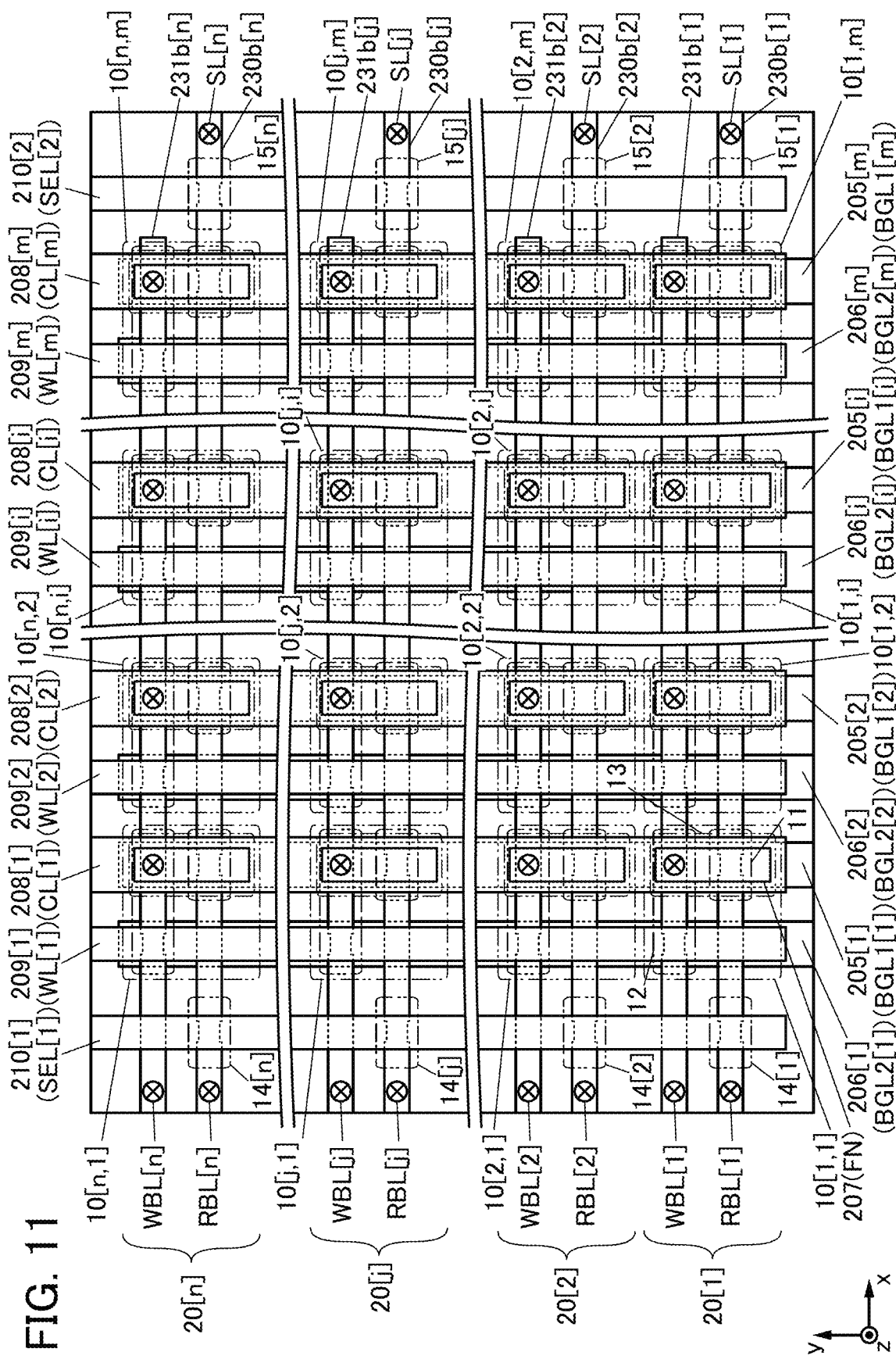
FIG. 11 is a schematic view of a memory cell array of one embodiment of the present invention.

FIG. 11 is a top view of the memory cell array 520 corresponding to the circuit diagram of FIG. 10. Note that for clarity of the drawing, some components are omitted in the top view of FIG. 11. In addition, for clarity of the drawing, some components such as the conductor 207 are indicated by not hidden lines but solid lines. Here, the structure of each memory cell 10 is similar to the structure illustrated in FIG. 1B, FIG. 2A, FIG. 2B, FIG. 3A, FIG. 3B, and the like, and thus the description in the above embodiment can be referred to.

As illustrated in FIG. 11, the memory cell array 520 includes m conductors 208[1] to 208[m] functioning as the wirings CL, m conductors 209[1] to 209[m] functioning as the wirings WL, m conductors 205[1] to 205[m] functioning as the wirings BGL1, m conductors 206[1] to 206[m] functioning as the wirings BGL2, a conductor 210[1] functioning as the wiring SEL[1], and a conductor 210[2] functioning as the wiring SEL[2], each of which extends in the y direction. The conductors 210 functioning as the wiring SEL[1] and the wiring SEL[2] are each formed using the same conductive material as the conductor 209.

As illustrated in FIG. 11, the memory cell array 520 includes n oxides 230b[1] to 230b[n] and n oxides 231b[1] to 231b[n], each of which extends in the x direction. One oxide 230b and one oxide 231b are provided for each memory cell string 20. A plug electrically connected to the wiring RBL is provided at one end portion of the oxide 230b, and a plug electrically connected to the wiring SL is provided at the other end portion of the oxide 230b. A plug electrically connected to the wiring WBL is provided at one end portion of the oxide 231b. Although not illustrated, the oxide 230a, the oxide 231a, the oxide 243, the oxide 245, the conductor 242, and the conductor 244 are provided to extend as appropriate, like the oxide 230b and the oxide 231b.

In the oxide 230b, the transistor 11 is formed in a portion overlapped by the conductor 208. In the oxide 231b, the transistor 12 is formed in a portion overlapped by the conductor 209, the transistor 14 is formed in a portion overlapped by the conductor 210[1], and the transistor 15 is formed in a portion overlapped by the conductor 210[2]. Here, the transistor 14 and the transistor 15 each have a structure similar to that of the transistor 11. Note that a top surface of a top gate of the transistor 14 is in contact with the conductor 210[1], and a top surface of a top gate of the transistor 15 is in contact with the conductor 210[2].

As in the structure illustrated in FIG. 3A, FIG. 3B, and the like, the memory cell array 520 includes the insulator 212 over a substrate (not illustrated), the insulator 214 over the insulator 212, the insulator 216 over the insulator 214, the insulator 222 over the insulator 216, the insulator 224 over the insulator 222, the insulator 275 over the insulator 224, the insulator 280 over the insulator 275, the insulator 282 over the insulator 280, and the insulator 283 over the insulator 282. In addition, m conductors 205 and m conductors 206 are placed in the same layer as the insulator 216, n oxides 230b, n oxides 231b, and the like are placed over the insulator 224, m conductors 209 are placed over the insulator 280, and m conductors 208 are placed over the insulator 282. In each memory cell 10, the transistor 11 and the transistor 12 are provided in a layer between the insulator 214 and the insulator 282, the capacitor element 13 is provided over the insulator 280, and the conductor 240 connecting the transistor 11 and the transistor 12 is provided.

For example, the memory cell 10[1,1] and the memory cell 10[1,2] included in the memory cell array 520 each also have the structure illustrated in FIG. 3A, FIG. 3B, and the like. Note that both the transistor 11 of the memory cell 10[1,2] and the transistor 11 of the memory cell 10[1,2] are formed in the oxide 230b[1]. Both the transistor 12 of the memory cell 10[1,2] and the transistor 12 of the memory cell 10[1,2] are formed in the oxide 231b[1].

As illustrated in FIG. 11, in the memory cell array 520 that is of a NAND type, there is no need to form a contact plug connected to the wiring WBL, the wiring RBL, or the like in each memory cell 10. Thus, there is no need to provide a space for forming an additional contact hole in the memory cell 10. Therefore, when the shape of the memory cell 10 is designed using a square surrounded by the oxide 230b, the oxide 231b, the conductor 208 (the wiring CL), and the conductor 209 (the wiring WL) as a reference, the area occupied by the memory cell 10 can be minimized.

Here, the layout of the oxide 230b, the oxide 231b, the conductor 208, and the conductor 209 is preferably designed such that the area of the memory cell 10 is as small as possible, using parasitic capacitance between wirings, the minimum feature size, or the like as a reference. In this case, the maximum value of the area of the memory cell 10 occupied by the conductor 208 functioning as the upper electrode of the capacitor element 13, i.e., the maximum value of the area that the capacitor element 13 can have, is limited. Therefore, it is preferable that the area where the designed conductor 208 overlap the conductor 207 be as large as possible.

In the memory cell 10 described in this embodiment and the like, the conductor 207 functioning as the node FN is placed to overlap the oxide 230b and the oxide 231b. Thus, the area where the conductor 208 and the conductor 207 overlap each other in the memory cell 10 can be enlarged in the y direction.

With such a structure, the capacitor element 13 with larger capacity can be provided in the limited area of the memory cell 10 with almost no increase in area. Thus, the area occupied by the memory cell 10 can be made small. High integration of semiconductor devices is thus possible and a semiconductor device with large storage capacity can be provided. A semiconductor device with low manufacturing cost per storage capacity can be provided.

Next, examples of data wiring operation and data reading operation of the memory cell array 520 are described with reference to FIG. 12A and FIG. 12B. The operations are described below using the memory cell string 20[1] of the case where m=4 as a model.

Figure 12A:
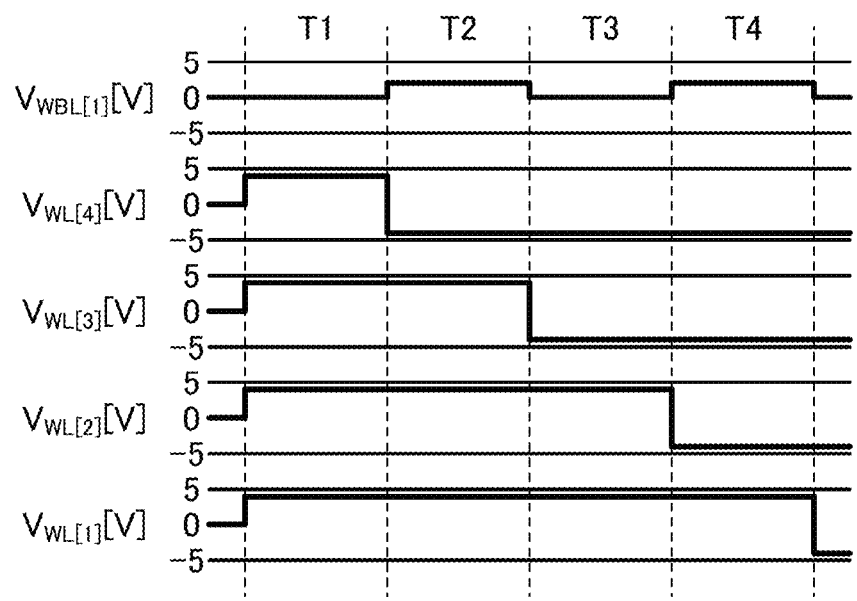
FIG. 12A and FIG. 12B are diagrams showing timing charts of a memory cell array of one embodiment of the present invention.

First, an example of wiring data to the memory cell string 20[1] in a period T1 to a period T4 is described using a timing chart shown in FIG. 12A. Here, FIG. 12A shows a potential $V_{WBL[1]}$ [V] of the wiring WBL[1], a potential $V_{WL[4]}$ [V] of the wiring WL[4], a potential $V_{WL[3]}$ [V] of the wiring WL[3], a potential $V_{WL[2]}$ [V] of the wiring WL[2], and a potential $V_{WL[1]}$ [V] of the wiring WL[1]. Note that from the period T1 to the period T4, potentials of the wiring RBL[1], the wiring SL[1], the wiring CL[1] to the wiring CL[4], the wiring BGL1[1] to the wiring BGL1[4], and the wiring BGL2[1] to the wiring BGL2[4] are each 0 V.

In the period T1, data 0 is written to the memory cell 10[1,4]. The potential $V_{WBL[1]}$ is set to a potential of the data 0 (e.g., 0 V), and the potential $V_{WL[4]}$ to the potential $V_{WL[1]}$ are each set to a potential (e.g., 4 V) where the transistors 11 of the memory cell 10[1,4] to the memory cell 10[1,1] are each brought into an on state. Accordingly, electrical continuity is established between the wiring WBL[1] and the node FN of the memory cell 10[1,4], so that the potential of the data 0 is supplied to the node FN. When the period T1 is switched to the period T2, the potential $V_{WL[4]}$ is set to a potential (e.g., −4 V) at which the transistor 11 is brought into an off state. Accordingly, the node FN of the memory cell 10[1,4] is brought into a floating state and the potential corresponding to the data 0 supplied to the node FN can be retained.

In the period T2, data 1 is written to the memory cell 10[1,3]. The potential $V_{WBL[1]}$ is set to a potential of the data 1 (e.g., 2 V), and the potential $V_{WL[3]}$ to the potential $V_{WL[1]}$ are each set to a potential (e.g., 4 V) where the transistors 11 of the memory cell 10[1,3] to the memory cell 10[1,1] are each brought into an on state. Accordingly, electrical continuity is established between the wiring WBL[1] and the node FN of the memory cell 10[1,3], so that the potential of the data 1 is supplied to the node FN. Since the transistor 11 of the memory cell 10[1,4] is in an off state at this time, the data 0 written to the memory cell 10[1,4] in the period T1 is retained. When the period T2 is switched to the period T3, the potential $V_{WL[3]}$ is set to a potential (e.g., −4 V) at which the transistor 11 is brought into an off state. Accordingly, the node FN of the memory cell 10[1,3] is brought into a floating state and the potential corresponding to the data 1 supplied to the node FN can be retained.

After that, the data 0 is written to the memory cell 10[1,2] in the period T3 in a manner similar to that of the period T1, and the data 1 is written to the memory cell 10[1,1] in the period T4 in a manner similar to that of the period T2.

Figure 12B:
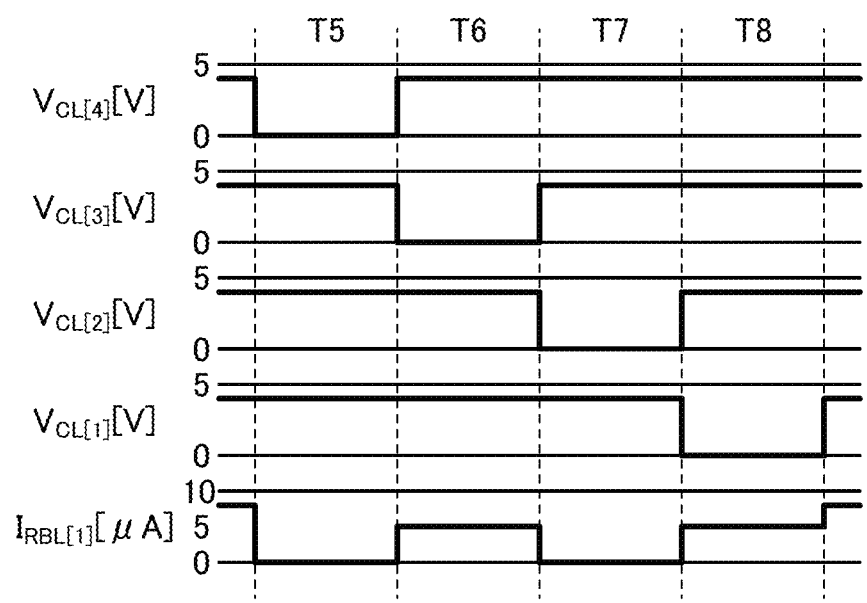

Next, an example of reading data in a period T5 to a period T8 from the memory cell string 20[1] to which the data has been written in the period T1 to the period T4 is described using a timing chart shown in FIG. 12B. Here, FIG. 12B shows a potential $V_{CL[4]}$ [V] of the wiring CL[4], a potential $V_{CL[3]}$ [V] of the wiring CL[3], a potential $V_{CL[2]}$ [V] of the wiring CL[2], a potential $V_{CL[1]}$ [V] of the wiring CL[1], and a current value $I_{RBL[1]}$ [μA] of the wiring RBL[1]. In the period T5 to the period T8, potentials of the wiring WL[1] to the wiring WL[4] are each −4 V, a potential of the wiring RBL[1] is 1.2 V, and potentials of the wiring SL[1], the wiring WBL[1], the wiring BGL1[1] to the wiring BGL1[4], and the wiring BGL2[1] to the wiring BGL2[4] are each 0 V. In addition, the transistor 14[1] and the transistor 15[1] are each in an on state.

In the period T5, the data 0 of the memory cell 10[1,4] is read. The potential $V_{CL[4]}$ is set to a reading potential (e.g., 0 V), and the potential $V_{CL[3]}$ to the potential $V_{CL[1]}$ are each set to a potential (e.g., 4 V) at which the transistors 11 of the memory cell 10[1,3] to the memory cell 10[1,1] are each brought into an on state regardless of the retained data. Thus, electrical continuity between the wiring RBL[1] and the wiring SL[1] is determined by the conduction state of the transistor 11 of the memory cell 10[1,4]. When a reading potential is supplied to the wiring CL, the transistor 11 of the memory cell 10 is brought into an off state in the case where the data 0 is retained, and the transistor 11 of the memory cell 10 is brought into an on state in the case where the data 1 is retained. As shown in FIG. 12B, $I_{RBL[1]}$ is 0 μA and there is no electrical continuity between the wiring RBL[1] and the wiring SL[1]; thus, it can be read that the data 0 is retained in the memory cell 10[1,4].

In the period T6, the data 1 of the memory cell 10[1,3] is read. The potential $V_{CL[3]}$ is set to a reading potential (e.g., 0 V), and the potential $V_{CL[4]}$, the potential $V_{CL[2]}$, and the potential $V_{CL[1]}$ are each set to a potential (e.g., 4 V) at which the transistors 11 of the memory cell 10[1,4], the memory cell 10[1,2], and the memory cell 10[1,1] are each brought into an on state regardless of the retained data. Thus, electrical continuity between the wiring RBL[1] and the wiring SL[1] is determined by the conduction state of the transistor 11 of the memory cell 10[1,3]. As shown in FIG. 12B, $I_{RBL[1]}$ has a positive value and there is electrical continuity between the wiring RBL[1] and the wiring SL[1]; thus, it can be read that the data 1 is retained in the memory cell 10[1,3].

After that, the data 0 is read from the memory cell 10[1,2] in the period T7 in a manner similar to that of the period T5, and the data 1 is read from the memory cell 10[1,1] in the period T8 in a manner similar to that of the period T6.

In the above manner, data can be written to and read from the memory cell string 20[1]. Although writing and reading are performed on one memory cell string 20 in the above description, data writing and reading can be performed on a plurality of memory cell strings 20 concurrently in a similar manner. For example, in the case of the memory cell array 520 illustrated in FIG. 10, data writing and reading can be performed on the memory cell string 20[1] to the memory cell string 20[n] concurrently.

Note that the data writing operation and the data reading operation of the memory cell array 520 are examples, and the present invention is not limited thereto. For example, as described in the above embodiment, the conductor 205 may function as the wiring CL supplying a reading potential and the conductor 208 may be a wiring supplied with the low power supply potential VSS in the data reading operation.

In addition, the layout of the memory cell array 520 is an example and the present invention is not limited thereto. For example, the wiring WBL may be provided not only at one end portion of the memory cell string 20 but also at the other end portion, that is, two wirings WBL may be connected to one memory cell string 20. With such a structure, data can be written to the memory cell string 20 from two directions concurrently in the above data writing operation, which can increase data writing speed.

Alternatively, for example, a structure may be employed where the wiring BGL1 and the wiring BGL2 are not provided or the wiring BGL1 and the wiring BGL2 extend in the x direction. Alternatively, the transistor 14 and the transistor 15 may each be provided with a back gate and the wiring BGL1.

Although the memory cell array 520 is a NAND memory cell array, the present invention is not limited thereto. For example, the oxide 230*b*, the oxide 231*b*, and the like may be patterned into an island-like shape in each memory cell 10 to form a NOR memory cell array.

The structure, method, and the like described above in this embodiment can be used in an appropriate combination with other structures, methods, and the like described in this embodiment or the other embodiments.

Embodiment 3

In this embodiment, application examples of the memory device of one embodiment of the present invention are described.

Figure 13:
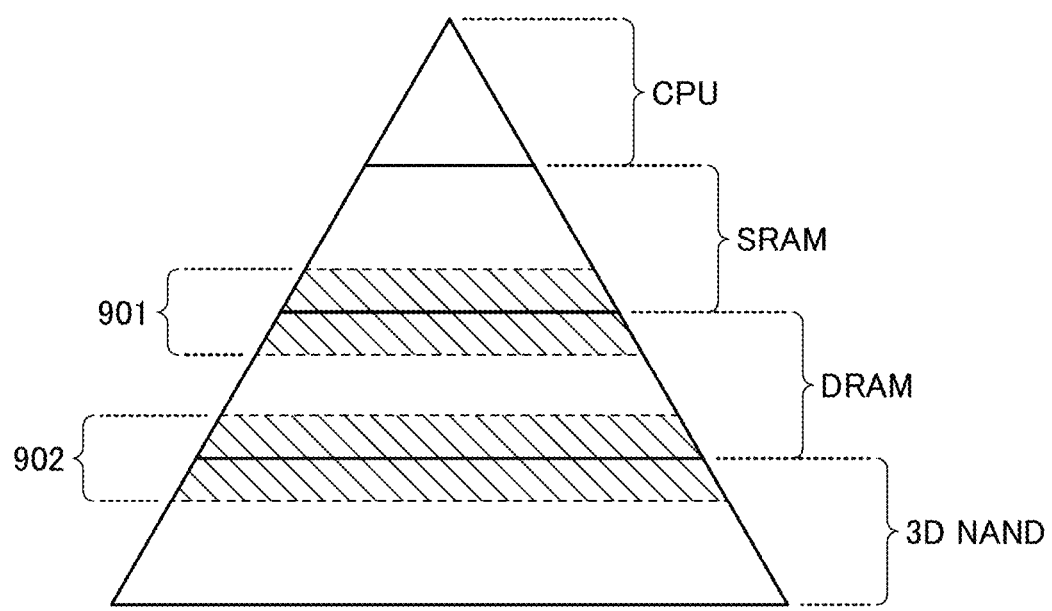
FIG. 13 is a diagram showing a hierarchy of a variety of memory devices.

In general, a variety of memory devices are used in semiconductor devices such as computers in accordance with the intended use. FIG. 13 shows a hierarchy of a variety of memory devices. The memory devices at the upper levels require high access speeds, and the memory devices at the lower levels require large memory capacity and high record density. In FIG. 13, sequentially from the top level, a memory included as a register in an arithmetic processing device such as a CPU, an SRAM (Static Random Access Memory), a DRAM (Dynamic Random Access Memory), and a 3D NAND memory are shown.

A memory included as a register in an arithmetic processing device such as a CPU is used for temporary storage of arithmetic operation results, for example, and thus is frequently accessed by the arithmetic processing device. Accordingly, high operation speed is required rather than memory capacity. The register also has a function of retaining settings of the arithmetic processing device, for example.

An SRAM is used for a cache, for example. The cache has a function of retaining a copy of part of data retained in a main memory. Copying data which is frequently used and retaining the copy of the data in the cache facilitates rapid data access.

A DRAM is used for the main memory, for example. The main memory has a function of retaining a program or data which are read from the storage. The record density of a DRAM is approximately 0.1 to 0.3 Gbit/mm$^2$.

A 3D NAND memory is used for the storage, for example. The storage has a function of retaining data that needs to be stored for a long time and a variety of programs used in an arithmetic processing device, for example. Therefore, the storage needs to have a high memory capacity and a high memory density rather than operating speed. The record density of a memory device used for the storage is approximately 0.6 to 6.0 Gbit/mm$^2$.

The memory device of one embodiment of the present invention has large storage capacity, operates fast, and can retain data for a long time. The memory device of one embodiment of the present invention can be favorably used as a memory device positioned in a boundary region 901 including both the level where the cache is positioned and the level where the main memory is positioned. The memory device of one embodiment of the present invention can be favorably used as a memory device positioned in a boundary region 902 including both the level where the main memory is positioned and the level where the storage is positioned.

The memory device of one embodiment of the present invention can be applied to, for example, memory devices of a variety of electronic devices (e.g., information terminals, computers, smartphones, e-book readers, digital still cameras, video cameras, video recording/reproducing devices, navigation systems, and game machines). The memory device can also be used for image sensors, IoT (Internet of Things), healthcare, and the like. Here, the computers refer not only to tablet computers, notebook computers, and desktop computers, but also to large computers such as server systems.

Alternatively, the memory device of one embodiment of the present invention is applied to a variety of removable memory devices such as memory cards (e.g., SD cards), USB memories, and SSDs (solid state drives). FIG. 14A to FIG. 14E schematically illustrate some structure examples of removable memory devices. The memory device of one embodiment of the present invention is processed into a packaged memory chip and used in a variety of memory devices and removable memories, for example.

Figure 14A:
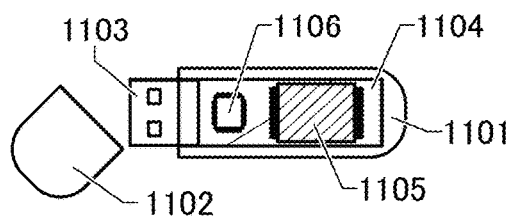
FIG. 14A to FIG. 14E are diagrams illustrating application examples of memory devices of one embodiment of the present invention.

FIG. 14A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

Figure 14B:
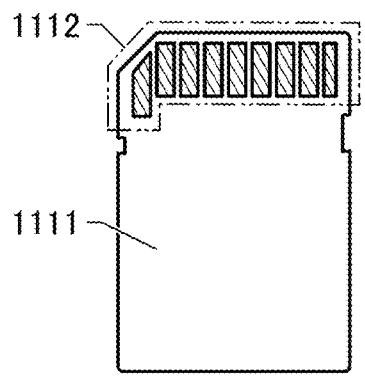
Figure 14C:
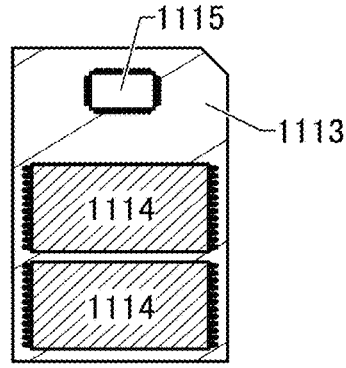

FIG. 14B is a schematic external view of an SD card, and FIG. 14C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. In this case, data can be read from and written in the memory chip 1114 by radio communication between a host device and the SD card 1110. The semiconductor device described in the above embodiment can be incorporated in the memory chip 1114 or the like on the substrate 1113.

Figure 14D:
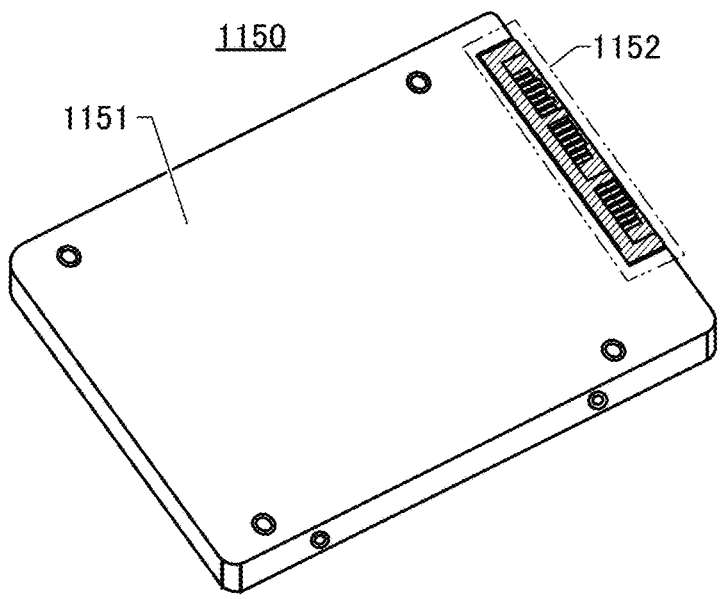
Figure 14E:
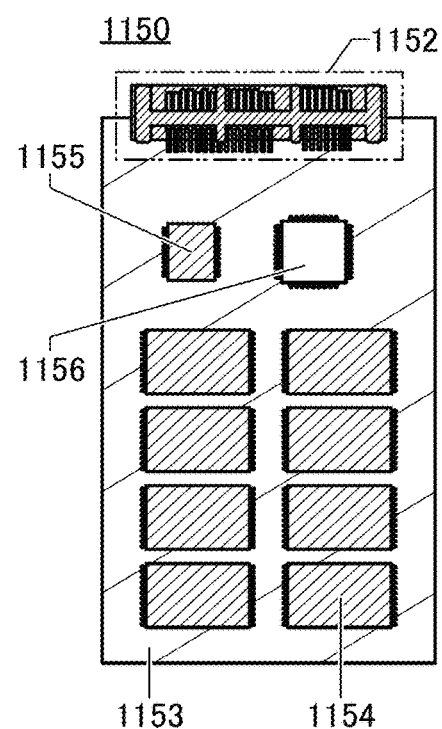

FIG. 14D is a schematic external view of an SSD, and FIG. 14E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

The structure, method, and the like described above in this embodiment can be used in an appropriate combination with other structures, methods, and the like described in this embodiment or the other embodiments.

Embodiment 4

FIG. 15 illustrates specific examples of electronic devices including the semiconductor device of one embodiment of the present invention.
<Electronic Device and System>

The semiconductor device of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, the semiconductor device of one embodiment of the present invention can be used as a component of artificial intelligence. With the use of the semiconductor device of one embodiment of the present invention, artificial intelligence can be included in the electronic device.

The electronic device of one embodiment of the present invention may include an antenna. When a signal is received by the antenna, a video, data, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, a current, a voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.
[Information Terminal]

Figure 15A:
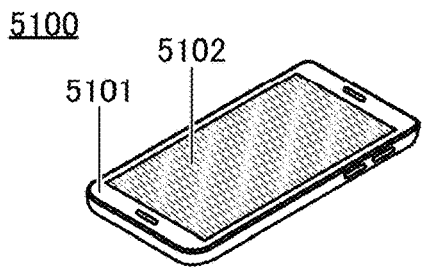
FIG. 15A to FIG. 15H are diagrams illustrating electronic devices of one embodiment of the present invention.

FIG. 15A illustrates a mobile phone (a smartphone), which is a type of information terminal. An information terminal 5100 includes a housing 5101 and a display portion 5102, and a touch panel is provided in the display portion 5102 and a button is provided in the housing 5101 as input interfaces.

The information terminal 5100 can execute an application utilizing artificial intelligence by using the semiconductor device of one embodiment of the present invention. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 15B:
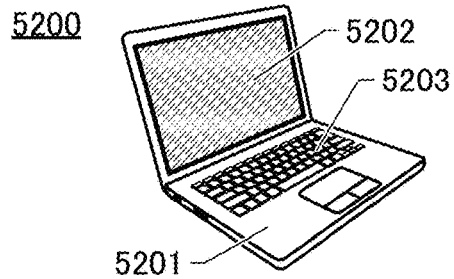

FIG. 15B illustrates a notebook information terminal 5200. The notebook information terminal 5200 includes a main body 5201 of the information terminal, a display portion 5202, and a keyboard 5203.

Like the information terminal 5100 described above, the notebook information terminal 5200 can execute an application utilizing artificial intelligence by using the semiconductor device of one embodiment of the present invention. Examples of the application utilizing artificial intelligence include design-support software, text correction software, and software for automatic menu planning. Furthermore, with the use of the notebook information terminal 5200, novel artificial intelligence can be developed.

Note that although FIG. 15A and FIG. 15B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.
[Game Machines]

Figure 15C:
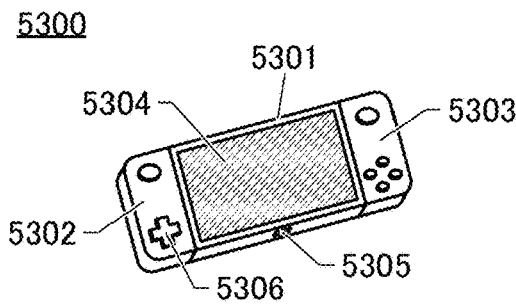

FIG. 15C illustrates a portable game machine 5300 as an example of a game machine.

The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The semiconductor device of one embodiment of the present invention can be incorporated into a chip provided on a substrate in the housing 5301, the housing 5302, and the housing 5303, for example.

Figure 15D:
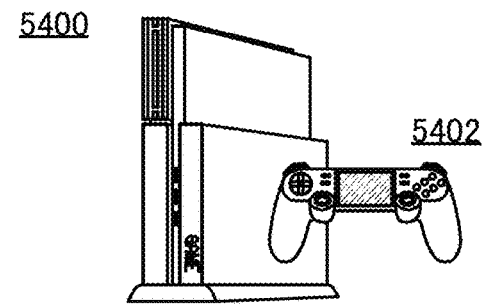

FIG. 15D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generated from a circuit can be reduced owing to low power consumption; thus, the influence of heat generation on the circuit, a peripheral circuit, and a module can be reduced.

Furthermore, when the semiconductor device of one embodiment of the present invention is used in the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, variations in questions posed by the player, the progress of the game, time, and the actions and words of the game characters can be expressed.

In addition, when a game requiring a plurality of players is played on the portable game machine 5300, the artificial intelligence can create a virtual game player; thus, the game can be played alone with the game player created by the artificial intelligence as an opponent.

Although FIG. 15C and FIG. 15D illustrate the portable game machine and the stationary game machine as examples of game machines, the game machine capable of using the semiconductor device of one embodiment of the present invention is not limited thereto. Examples of the game machine capable of using the semiconductor device of one embodiment of the present invention include an arcade game machine installed in entertainment facilities (a game center, an amusement park, and the like), and a throwing machine for batting practice installed in sports facilities.

[Large Computer]

The semiconductor device of one embodiment of the present invention can be used in a large computer.

Figure 15E:
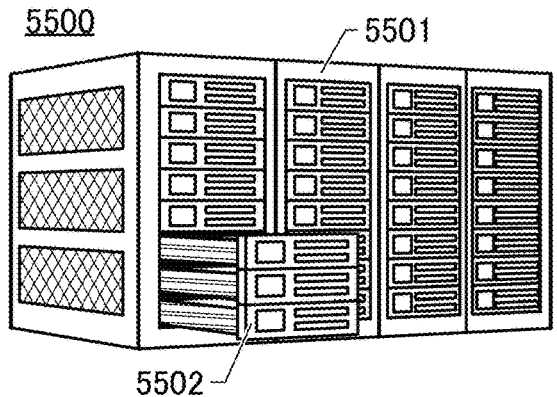
Figure 15F:
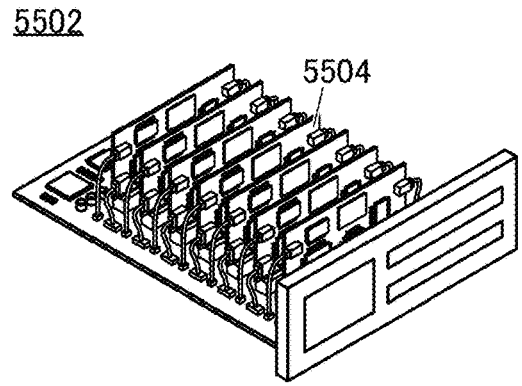

FIG. 15E is a diagram illustrating a supercomputer 5500 as an example of a large computer. FIG. 15F is a diagram illustrating a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504, and the semiconductor devices of one embodiment of the present invention can be mounted on the substrates.

The supercomputer 5500 is a large computer mainly used for scientific computation. In scientific computation, an enormous amount of arithmetic operation needs to be processed at high speed; hence, power consumption is high and chips generate a large amount of heat. Using the semiconductor device of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although FIG. 15E and FIG. 15F illustrate a supercomputer as an example of a large computer, a large computer using the semiconductor device of one embodiment of the present invention is not limited thereto. Examples of a large computer using the semiconductor device of one embodiment of the present invention include a computer that provides service (a server) and a large general-purpose computer (a mainframe).

[Moving Vehicle]

The semiconductor device of one embodiment of the present invention can be used in an automobile, which is a moving vehicle, and around a driver's seat in the automobile.

Figure 15G:
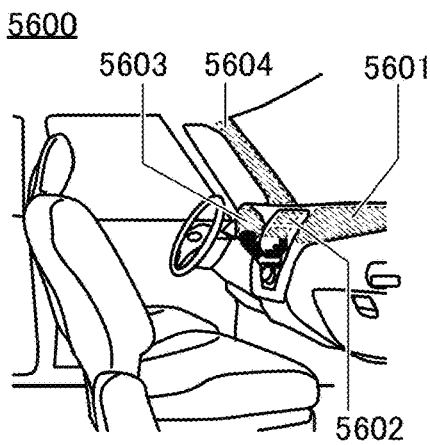

FIG. 15G illustrates an area around a windshield inside an automobile 5600, which is an example of a moving vehicle. FIG. 15G illustrates a display panel 5601, a display panel 5602, and a display panel 5603 that are attached to a dashboard and a display panel 5604 that is attached to a pillar.

The display panel 5601 to the display panel 5603 can provide a variety of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5601 to the display panel 5603 can also be used as lighting devices.

The display panel 5604 can compensate for the view obstructed by the pillar (a blind spot) by showing a video taken by an imaging device (not illustrated) provided on the automobile. That is, displaying an image taken by the imaging device provided outside the automobile leads to compensation for the blind spot and an increase in safety. In addition, showing a video to compensate for a portion that cannot be seen enables the driver to confirm the safety more naturally and comfortably. The display panel 5604 can also be used as a lighting device.

Since the semiconductor device of one embodiment of the present invention can be used as a component of artificial intelligence, the chip can be used for an automatic driving system of the automobile, for example. The chip can also be used for a system for navigation, risk prediction, or the like. A structure may be employed where the display panel 5601 to the display panel 5604 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the semiconductor device of one embodiment of the present invention is used in these moving vehicles.

[Electrical Appliance]

Figure 15H:
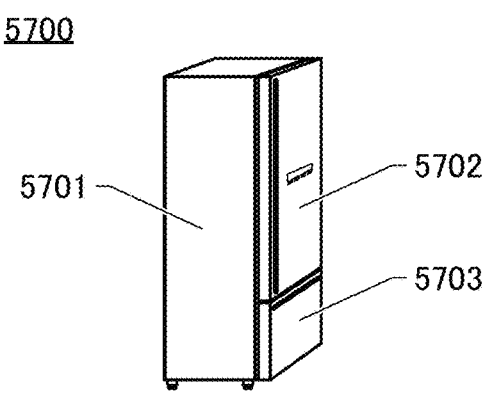

FIG. 15H illustrates an electric refrigerator-freezer 5700 as an example of an electrical appliance. The electric refrigerator-freezer 5700 includes a housing 5701, a refrigerator door 5702, a freezer door 5703, and the like.

When the semiconductor device of one embodiment of the present invention is used in the electric refrigerator-freezer 5700, the electric refrigerator-freezer 5700 including artificial intelligence can be achieved. Utilizing the artificial intelligence enables the electric refrigerator-freezer 5700 to have a function of automatically planning a menu based on foods stored in the electric refrigerator-freezer 5700, expiration dates of the foods, or the like, a function of automatically adjusting temperature to be appropriate for the foods stored in the electric refrigerator-freezer 5700, and the like.

Although the electric refrigerator-freezer is described as an example of an electrical appliance, examples of other electrical appliances include a vacuum cleaner, a microwave oven, an electronic oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

The structure, method, and the like described above in this embodiment can be used in an appropriate combination with other structures, methods, and the like described in this embodiment or the other embodiments.

REFERENCE NUMERALS

BGL1: wiring, BGL2: wiring, CL: wiring, RBL: wiring, SL: wiring, SEL: wiring, T1: period, T2: period, T3: period, T4: period, T5: period, T6: period, T7: period, T8: period, WBL: wiring, WL: wiring, 10: memory cell, 11: transistor, 12: transistor, 13: capacitor element, 14: transistor, 15: transistor, 20: memory cell string, 205: conductor, 205a: conductor, 205b: conductor, 205c: conductor, 206: conductor, 206a: conductor, 206b: conductor, 206c: conductor, 207: conductor, 208: conductor, 209: conductor, 210: conductor, 212: insulator, 214: insulator, 216: insulator, 222: insulator, 224: insulator, 230: oxide, 230a: oxide, 230b: oxide, 230c: oxide, 231: oxide, 231a: oxide, 231b: oxide, 231c: oxide, 232a: region, 232b: region, 232c: region, 240: conductor, 241: insulator, 242: conductor, 242a: conductor, 242b: conductor, 243: oxide, 243a: oxide, 243b: oxide, 244: conductor, 244a: conductor, 244b: conductor, 245: oxide, 245a: oxide, 245b: oxide, 250: insulator, 251: insulator, 260: conductor, 260a: conductor, 260b: conductor, 261: conductor, 261a: conductor, 261b: conductor, 275: insulator, 280: insulator, 282: insulator, 283: insulator, 500: semiconductor device, 510: driver circuit, 511: peripheral circuit, 512: control circuit, 515: peripheral circuit, 520: memory cell array, 521: row decoder, 522: column decoder, 523: row driver, 524: column driver, 525: input circuit, 526: output circuit, 527: sense amplifier, 528: voltage generation circuit, 541: PSW, 542: PSW, 901: boundary region, 902: boundary region, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: game machine, 5402: controller, 5500: supercomputer, 5501: rack, 5502: computer, 5504: substrate, 5600: car, 5601: display panel, 5602: display panel, 5603: display panel, 5604: display panel, 5700: electric refrigerator-freezer, 5701: housing, 5702: refrigerator door, 5703: freezer door This application is based on Japanese Patent Application Serial No. 2019-163639 filed on Sep. 9, 2019, the entire contents of which are hereby incorporated herein by reference.

The invention claimed is:

1. A semiconductor device comprising:
   a first transistor comprising:
      a first oxide semiconductor film;
      a first gate insulator over the first oxide semiconductor film;
      a first gate electrode over the first gate insulator;
      a first source electrode; and
      a first drain electrode;
   a second transistor comprising:
      a second oxide semiconductor film;
      a second gate insulator over the second oxide semiconductor film;
      a second gate electrode over the second gate insulator;
      a second source electrode; and
      a second drain electrode;
   a first insulator over the first oxide semiconductor film and the second oxide semiconductor film, the first insulator comprising a first opening, a second opening and a third opening;
   a first conductor positioned in the third opening; and
   a capacitor element comprising:
      a second conductor over and in contact with a top surface of the first conductor, a top surface of the first gate electrode, and a top surface of the first insulator;
      a second insulator over the second conductor; and
      a third conductor over the second insulator,
   wherein the first opening reaches the first oxide semiconductor film,
   wherein the second opening reaches the second oxide semiconductor film,
   wherein the third opening reaches one of the second source electrode and the second drain electrode,
   wherein each of the first gate insulator and the first gate electrode is positioned in the first opening,
   wherein each of the second gate insulator and the second gate electrode is positioned in the second opening, and
   wherein the one of the second source electrode and the second drain electrode is electrically connected to the first gate electrode via the first conductor.

2. The semiconductor device according to claim 1, wherein a part of the first gate electrode is exposed from the second conductor and is in contact with the second insulator.

3. The semiconductor device according to claim 1, wherein a channel length direction of the first transistor and a channel length direction of the second transistor are substantially parallel to each other.

4. The semiconductor device according to claim 1, wherein an extending direction of the third conductor is substantially perpendicular to a channel length direction of the first transistor.

5. The semiconductor device according to claim 1, further comprising a fourth conductor over and in contact with a top surface of the second gate electrode,
   wherein an extending direction of the fourth conductor is substantially perpendicular to a channel length direction of the second transistor.

6. The semiconductor device according to claim 5, wherein the fourth conductor overlaps the first oxide semiconductor film with the first insulator therebetween.

7. The semiconductor device according to claim 1,
   wherein each of the first oxide semiconductor film and the second oxide semiconductor film comprises indium, an element M, and zinc, and
   wherein the element M is one or more selected from gallium, aluminum, yttrium and tin.

8. The semiconductor device according to claim 1,
   wherein the second insulator is in contact with the second conductor and the third conductor, and
   wherein a thickness of the second insulator is 5 nm or less.

9. A semiconductor device comprising:
   a first transistor comprising:
      a first oxide semiconductor film;
      a first gate insulator over the first oxide semiconductor film;
      a first gate electrode over the first gate insulator;
      a first source electrode; and
      a first drain electrode;
   a second transistor comprising:
      a second oxide semiconductor film;
      a second gate insulator over the second oxide semiconductor film;
      a second gate electrode over the second gate insulator;
      a second source electrode; and
      a second drain electrode;
   a third transistor comprising:
      the first oxide semiconductor film; and
      a third gate electrode over the first oxide semiconductor film;
   a fourth transistor comprising:
      the second oxide semiconductor film;
      a fourth gate electrode over the second oxide semiconductor film;
      a third source electrode; and
      a third drain electrode;

a first insulator over the first oxide semiconductor film and the second oxide semiconductor film, the first insulator comprising:
  a first opening reaching the first oxide semiconductor film, where each of the first gate insulator and the first gate electrode is positioned in the first opening;
  a second opening reaching the second oxide semiconductor film, where each of the second gate insulator and the second gate electrode is positioned in the second opening;
  a third opening reaching one of the second source electrode and the second drain electrode,
  a fourth opening reaching the first oxide semiconductor film, where the third gate electrode is positioned in the fourth opening;
  a fifth opening reaching the second oxide semiconductor film, where the fourth gate electrode is positioned in the fifth opening; and
  a sixth opening,
a first conductor positioned in the third opening;
a first capacitor element comprising:
  a second conductor over and in contact with a top surface of the first conductor, a top surface of the first gate electrode, and a top surface of the first insulator;
  a second insulator over the second conductor; and
  a third conductor over the second insulator;
a fourth conductor positioned in the sixth opening; and
a second capacitor element comprising:
  a fifth conductor over and in contact with a top surface of the fourth conductor, a top surface of the third gate electrode, and a top surface of the first insulator;
  a third insulator over the second insulator; and
  a sixth conductor over the second insulator,
wherein the one of the second source electrode and the second drain electrode is electrically connected to the first gate electrode via the first conductor, and
wherein the one of the third source electrode and the third drain electrode is electrically connected to the first gate electrode via the first conductor.

10. The semiconductor device according to claim 9, wherein each of the first oxide semiconductor film and the second oxide semiconductor film comprises indium, an element M, and zinc, and
wherein the element M is one or more selected from gallium, aluminum, yttrium and tin.

11. The semiconductor device according to claim 9, wherein the second insulator is in contact with the second conductor and the third conductor,
wherein a material of the second insulator is aluminum oxide, and
wherein a thickness of the second insulator is 5 nm or less.

* * * * *